US010923375B2

(12) United States Patent
Sunugatov et al.

(10) Patent No.: US 10,923,375 B2
(45) Date of Patent: Feb. 16, 2021

(54) LOAD PORT MODULE

(71) Applicant: Brooks Automation, Inc., Chelmsford, MA (US)

(72) Inventors: Radik Sunugatov, Santa Clara, CA (US); Robert Carlson, Milpitas, CA (US); Mike Krolak, Los Gatos, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 16/692,359

(22) Filed: Nov. 22, 2019

(65) Prior Publication Data

US 2020/0168493 A1 May 28, 2020

Related U.S. Application Data

(60) Provisional application No. 62/772,376, filed on Nov. 28, 2018.

(51) Int. Cl.
*H01L 21/67* (2006.01)
*H01L 21/677* (2006.01)
*B65G 1/137* (2006.01)

(52) U.S. Cl.
CPC ........ *H01L 21/67742* (2013.01); *B65G 1/137* (2013.01)

(58) Field of Classification Search
None
See application file for complete search history.

(56) References Cited

U.S. PATENT DOCUMENTS

| 9,536,765 B2 | 1/2017 | Iwamoto et al. |
| 9,620,399 B2 | 4/2017 | Tanimura et al. |
| 2013/0011223 A1 | 1/2013 | Emoto et al. |
| 2013/0213442 A1 | 8/2013 | Kaise et al. |
| 2018/0161830 A1 | 6/2018 | Sasaki et al. |
| 2018/0226284 A1 | 8/2018 | Blahnik |

FOREIGN PATENT DOCUMENTS

KR 101619379 5/2016

OTHER PUBLICATIONS

International Search Report and Written Opinion, International Application No. PCT/US19/63426, dated Feb. 7, 2020.

*Primary Examiner* — Ronald P Jarrett
(74) *Attorney, Agent, or Firm* — Perman & Green, LLP; Colin C. Durham

(57) ABSTRACT

A substrate loading device including a frame adapted to connect to a substrate processing apparatus, the frame having a transport opening through which substrates are transported to the processing apparatus, a cassette support connected to the frame for holding at least one substrate cassette container proximate the transport opening, the support configured so that a sealed internal atmosphere of the container is accessed from the support at predetermined access locations of the container, and the cassette support has a predetermined continuous steady state differential pressure plenum region, determined at least in part by boundaries of fluid flow generating differential pressure, so that the predetermined continuous steady state differential pressure plenum region defines a continuously steady state fluidic flow isolation barrier disposed on the support between the predetermined access locations of the container and another predetermined section of the support isolating the other predetermined section from the predetermined access locations.

33 Claims, 21 Drawing Sheets

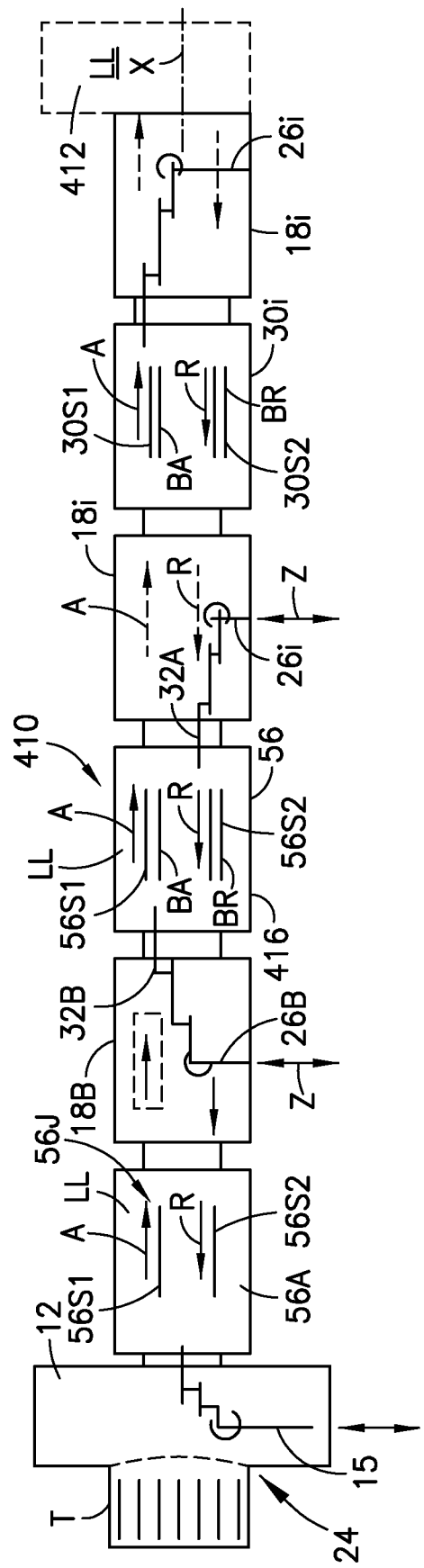

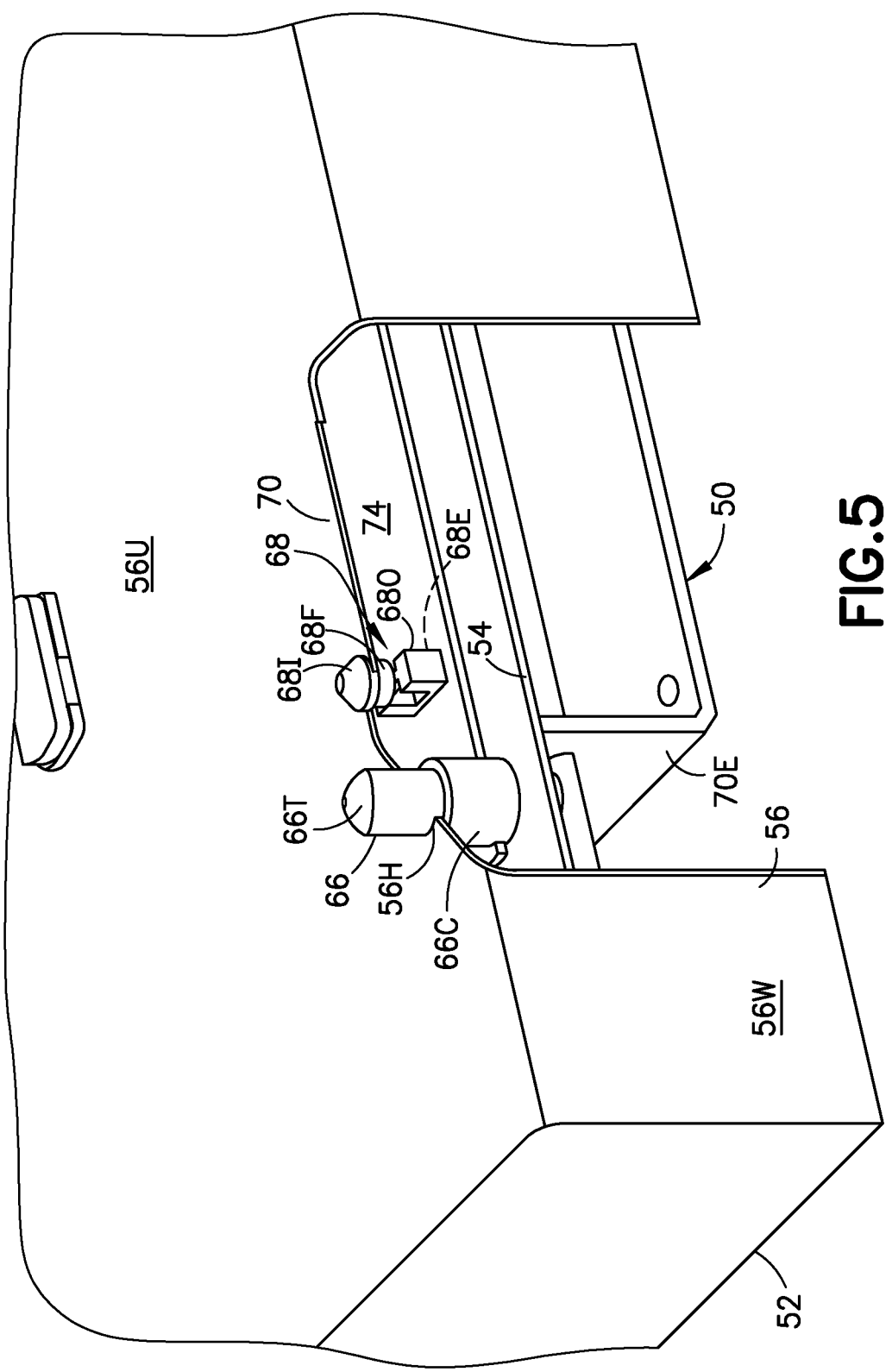

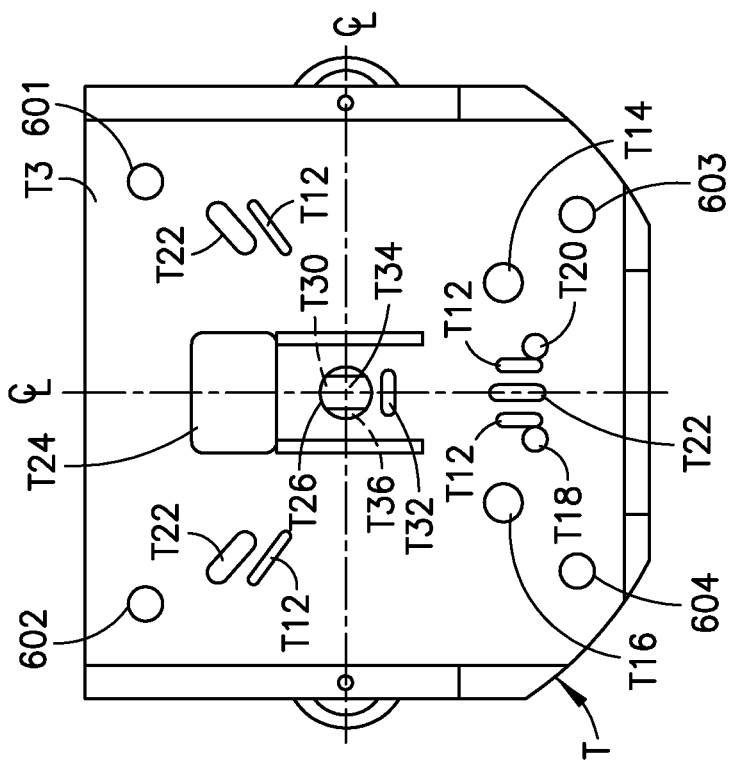
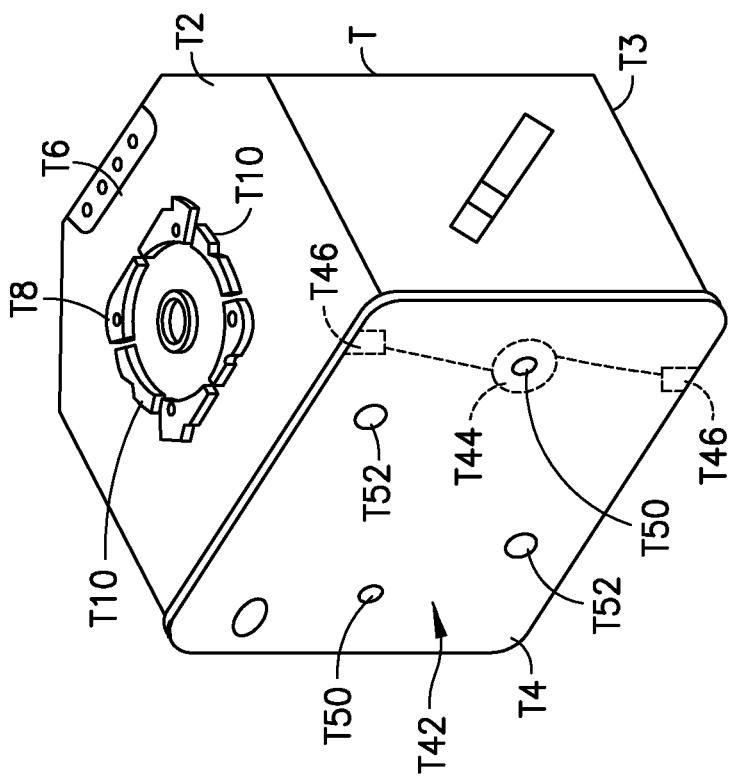

LOAD PORT MODULE

CROSS-REFERENCE TO RELATED APPLICATIONS

This Non-provisional Application claims priority from and benefit of U.S. provisional application No. 62/772,376, filed Nov. 28, 2018, the disclosure of which is incorporated herein by reference in its entirety.

BACKGROUND

1. Field

The aspects of the present disclosure generally relate to substrate processing apparatus and, more particularly, to an improved load port module for the substrate processing apparatus.

2. Brief Description of Related Developments

In a semiconductor fabrication (also referred to as a "fab") environment, during some semiconductor fabrication processes, load ports are subjected to corrosive gases (e.g., such as hydrogen bromide gas, hydrochloric acid gas, etc.) that may adversely affect exposed components of the load ports. These exposed components of the load ports are typically coated with an anti-corrosion coating to mitigate the exposure to the corrosive gases.

Providing other corrosive gas mitigation has proven difficult and expensive due to, for example, the unpredictable nature of gas flow (such as from purge vents of the load port or other gas sources) due to, for example: different geometries of the front opening unified pods (referred to as "FOUPS") held by the load port; an amount of out-gassing of components within the FOUP may be different from FOUP to FOUP, numbers of wafers or substrates held by the FOUP may be different from FOUP to FOUP, etc. Providing coatings on the load port components that may or may not be subjected to the corrosive gas increases cost of the load port. In addition, modifications of the load ports to accommodate the coatings and/or to redirect the corrosive gas also increase cost, increase complexity of load port, and increase manufacturing lead time of the load port.

BRIEF DESCRIPTION OF THE DRAWINGS

The foregoing aspects and other features of the present disclosure are explained in the following description, taken in connection with the accompanying drawings, wherein:

FIG. 1C is a schematic illustration of a substrate processing apparatus in accordance with aspects of the present disclosure;

FIG. 5 is a schematic illustration of a portion of the load port module of FIG. 2 in accordance with aspects of the present disclosure;

FIGS. 6A and 6B are schematic illustrations of a substrate transport container;

DETAILED DESCRIPTION

Figure 1A:
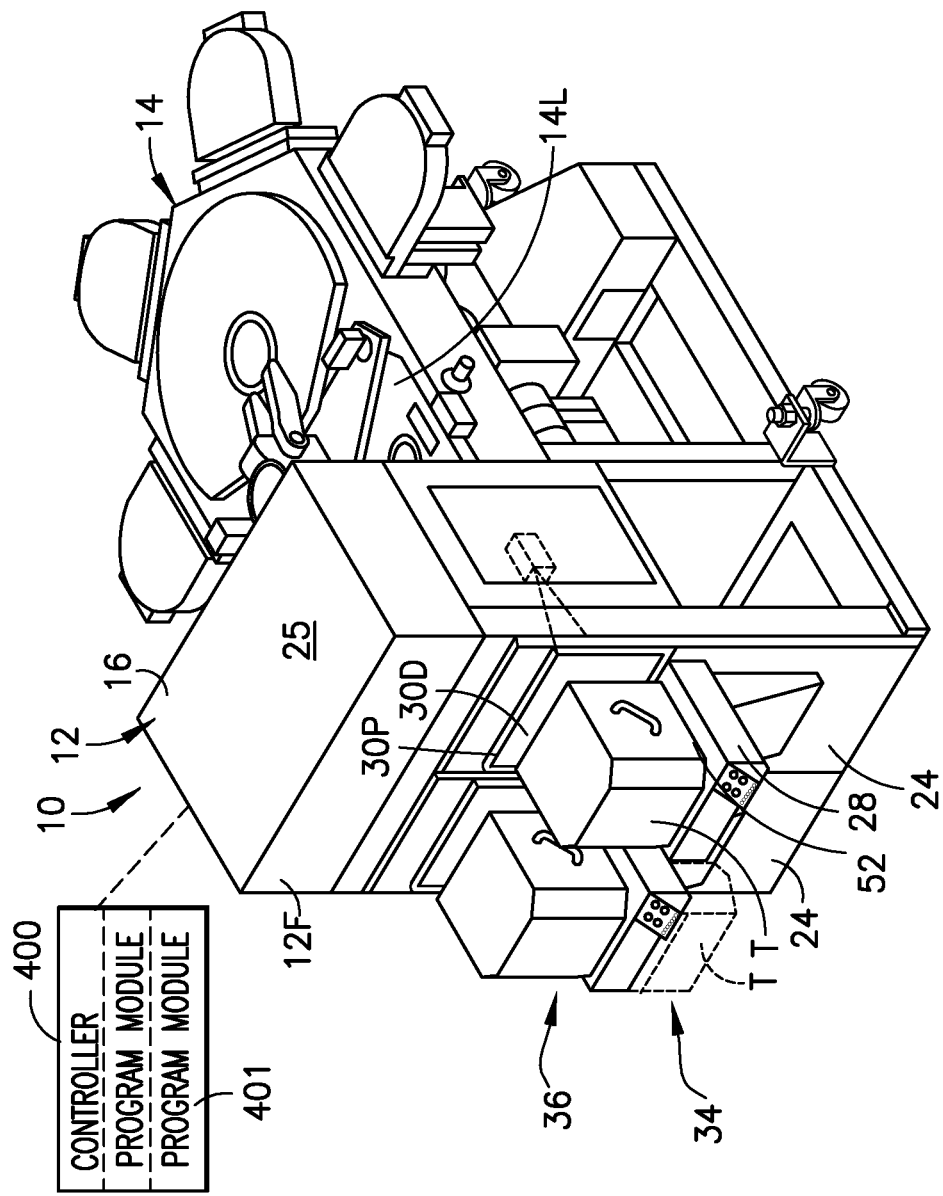
FIG. 1A is a schematic perspective view of a substrate processing apparatus in accordance with aspects of the present disclosure.

Referring to FIG. 1A, a perspective view of a substrate processing apparatus 10 incorporating features of the present disclosure is illustrated. Although the present disclosure will be described with reference to the aspects shown in the drawings, it should be understood that the present disclosure can be embodied in many alternate forms of aspects. In addition, any suitable size, shape or type of elements or materials could be used.

In the aspect illustrated in FIG. 1A, the apparatus 10 has been shown, for example purposes only, as having a general substrate batch processing tool configuration. In alternate embodiments, the substrate processing apparatus may have any other suitable configuration, as the features of the present invention, as will be described in greater detail below, are equally applicable to any substrate processing tool configuration including tools for individual substrate processing and/or linear tool stations such as those illustrated in FIGS. 1B and 1C and described in U.S. patent application Ser. No. 11/442,511, entitled "Linearly Distributed Semiconductor Workpiece Processing Tool," filed May 26, 2006, the disclosure of which is incorporated by reference herein in its entirety. The apparatus 10 may be capable of handling and processing any desired type of flat panel or substrate such as 200 mm or 300 mm semiconductor wafers, semiconductor packaging substrates (e.g. high density interconnects), semiconductor manufacturing process imaging plates (e.g. masks or reticles), and substrates for flat panel displays. The apparatus 10 may generally comprise a front section 12 and a rear section 14. The front section 12 (the term front is used here for convenience to identify an exemplary frame of reference, and in alternate embodiments the front of the apparatus may be established on any desired side of the apparatus). The front section 12 has a system (as will be described in greater detail below) providing an interface allowing the importation of substrates from the fab into the interior of the apparatus 10. The front section 12 also generally has a housing 16 and automation components located in the housing handling substrates between the rear section 14 and the front section interface to the exterior. The rear section 14 is connected to the housing 16 of the front section. The rear section 14 of the apparatus may have a controlled atmosphere (e.g. vacuum, inert gas), and generally comprises a processing system for processing substrates. For example, the rear section may generally include a central transport chamber, with substrate transport device, and peripheral processing modules for performing desired manufacturing processes to substrates within the apparatus (e.g. etching, material deposition, cleaning, baking, inspecting, etc.). Substrates may be transported, within the fab, to the processing apparatus 10 in containers T (also known as carriers). The containers T may be positioned on or in proximity to the front section interface. From the containers, the substrates may be brought through the interface, such as BOLTS (Box Opener/Loader to Tool Standard) interface, into the front section 12 using automation components in the front section. The substrates may them be transported, via load locks, to the atmospherically controlled rear section for processing in one or more of the processing modules. Processed substrates may then be returned, in a substantially reversed manner, to the front section 12 and then to the transport containers T for removal.

The front section 12, which may otherwise be referred to as an environmental front end module or EFEM, may have a shell or casing defining a protected environment, or mini-environment where substrates may be accessed and handled with minimum potential for contamination between the transport containers T, used to transport the substrates within the FAB, and the load locks 14L providing entry to the controlled atmosphere in the rear processing section 14. Load ports or load port modules 24 (one or more in number as will be described further below) are located on one or more of the sides of the front section providing the interface between the front section and FAB. The load port modules may be substantially similar to those described in U.S. Pat. No. 8,821,099 and entitled "Load Port Module", issued on Sep. 2, 2014, the disclosure of which is incorporated herein by reference in its entirety. The load port modules 24 may have closable ports 30P forming a closable interface, such as the BOLTS interface, between the EFEM interior and exterior. As seen in FIG. 1A, the load port modules may have a support area for a substrate transport container T. A secondary holding area may also be provided under the support area, where transport containers may be temporarily buffered. The transport container support area may allow automated movement of the transport container T supported thereon to a final or docked position. A port door, of the load port module, may engage the transport container when in a docked position in order to open the transport container while also opening the access port 30P in the load port frame, to provide access to substrates within the transport container as well as access for transporting the substrates between the container and EFEM interior. Engagement between the port door and transport container may be effected by independently operable keys as described in U.S. Pat. No. 8,821,099. In accordance with the aspects of the present disclosure, the load port module(s) 24 described herein include a differential pressure plenum space or region on or adjacent to a shuttle 52 of the load port 24. As will be described herein, the differential pressure plenum substantially contains and/or evacuates any corrosive gases that may escape (e.g., gases that are vented) from the substrate transport container T, disposed on the shuttle and interfaced with the load port 24, through the container door seal and/or substantially at the start (and/or substantially at the end) of purging/venting of the substrate transport container T by the load port 24. The differential pressure plenum may also substantially contain and/or evacuate corrosive gases that escape or are vented substantially at the opening of the substrate transport container T door by the load port 24. The differential pressure plenum may substantially prevent corrosive gas contact with, for example, any suitable components of the load port 24 including, but not limited to, printed circuit boards (PCBs) 74 (FIG. 5), linear bearing(s) 283 (FIG. 3), motors (see e.g., motor 53 (FIG. 4D), sensors (see sensors T12-T20 (FIG. 4B), sensor 680 (FIG. 5), switches 68 (FIG. 5), sensor 92 (FIG. 4C)), wire harness(es) 72 (FIG. 4D), detection system(s) 110 (FIG. 2), and/or other suitable components of the load port 24 that are in proximity of the container T disposed on the load port 24.

Figure 1B:
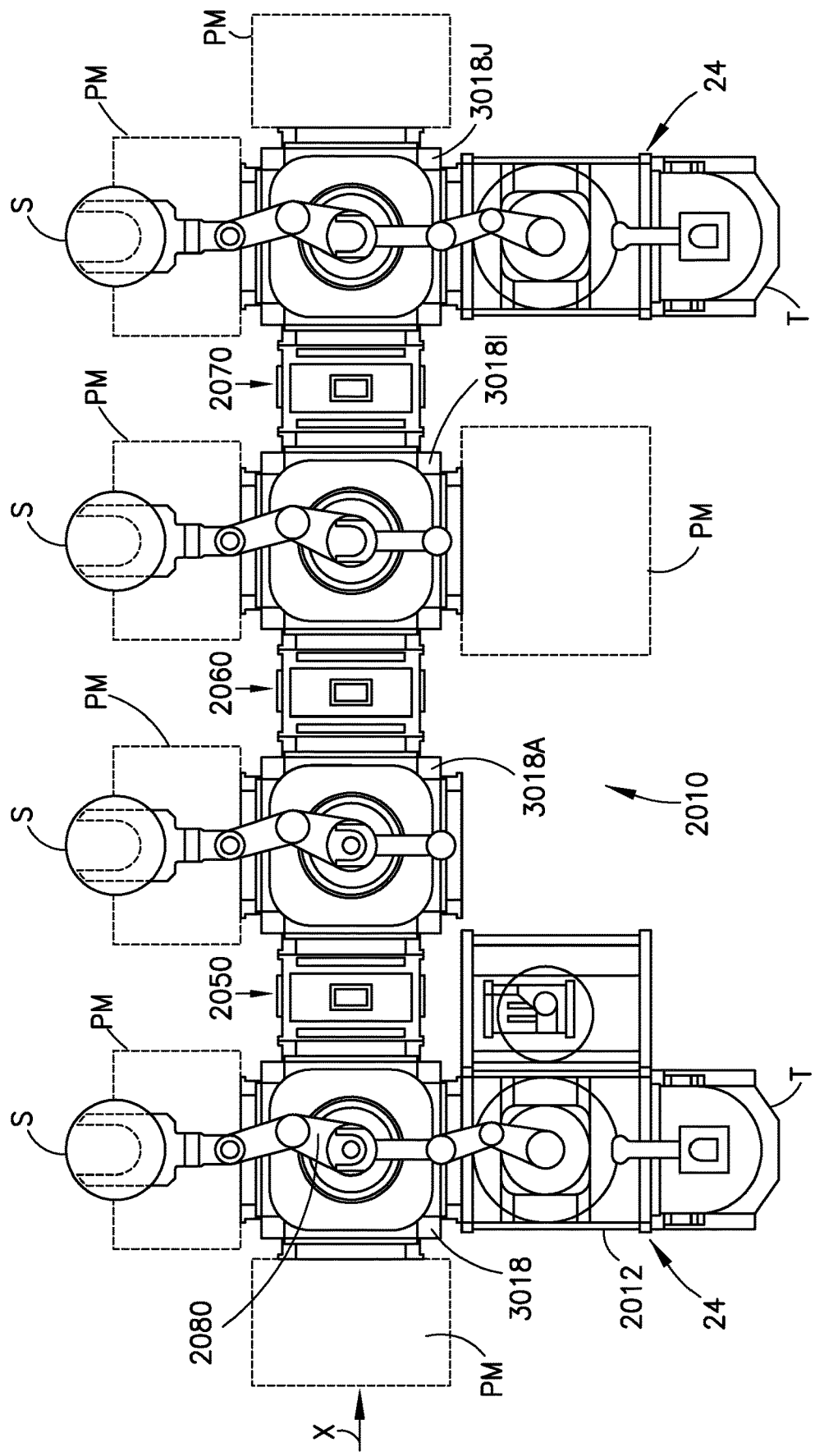
FIG. 1B is a schematic illustration of a substrate processing apparatus in accordance with aspects of the present disclosure.

Referring now to FIG. 1B, a schematic plan view of a linear substrate processing system 2010 is shown where the tool interface section 2012 is mounted to a transfer chamber module 3018 so that the interface section 2012 is facing generally towards (e.g. inwards) but is offset from the longitudinal axis X of the transfer chamber 3018. The transfer chamber module 3018 may be extended in any suitable direction by attaching other transfer chamber modules 3018A, 3018I, 3018J to interfaces 2050, 2060, 2070 as described in U.S. patent application Ser. No. 11/442,511, previously incorporated herein by reference. Each transfer chamber module 3018, 3019A, 3018I, 3018J includes a substrate transport 2080 for transporting substrates throughout the processing system 2010 and into and out of, for example, processing modules PM. As may be realized, each chamber module may be capable of holding an isolated, controlled or sealed atmosphere (e.g. N2, clean air, vacuum).

Referring to FIG. 1C, there is shown a schematic elevation view of an exemplary processing tool 410 such as may be taken along longitudinal axis X of the linear transfer chamber 416. In one aspect, as shown in FIG. 1C, the tool interface section 12 may be representatively connected to the transfer chamber 416. In this aspect, interface section 12 may define one end of the tool transfer chamber 416. As seen in FIG. 1C, the transfer chamber 416 may have another workpiece entry/exit station 412 for example at an opposite end from interface section 12. In other aspects, other entry/exit stations for inserting/removing work pieces from the transfer chamber may be provided such as between the ends of the tool transfer chamber 416. In one aspect of the present disclosure, interface section 12 and entry/exit station 412 may allow loading and unloading of workpieces from the tool. In other aspects, workpieces may be loaded into the tool from one end and removed from the other end. In one aspect, the transfer chamber 416 may have one or more transfer chamber module(s) 18B, 18i. Each chamber module may be capable of holding an isolated, controlled or sealed atmosphere (e.g. N2, clean air, vacuum). As noted before, the configuration/arrangement of the transfer chamber modules 18B, 18i, load lock modules 56A, 56B and workpiece stations forming the transfer chamber 416 shown in FIG. 1C is merely exemplary, and in other aspects the transfer chamber may have more or fewer modules disposed in any desired modular arrangement. In one aspect station 412 may be a load lock. In other aspects, a load lock module may be located between the end entry/exit station (similar to station 412) or the adjoining transfer chamber module (similar to module 18*i*) may be configured to operate as a load lock. As also noted before, transfer chamber modules 18B, 18*i* have one or more corresponding transport apparatus 26B, 26*i* located therein. The transport apparatus 26B, 26*i* of the respective transfer chamber modules 18B, 18*i* may cooperate to provide the linearly distributed workpiece transport system 420 in the transfer chamber. In other aspects the transfer chamber modules 18B may be configured to allow any suitable transport cart (not shown) to travel between transfer chamber modules 18B along at least a portion of the length of the linear transfer chamber 416. As may be realized the transport cart 900 may include any suitable transport apparatus mounted thereto and substantially similar to those transport apparatuses described herein. As shown in FIG. 1C, in one aspect the arms of the transport apparatus 26B may be arranged to provide what may be referred to as fast swap arrangement allowing the transport to quickly swap wafers from a pick/place location as will also be described in further detail below. The transport arm 26B may have a suitable drive section for providing each arm with three (3) (e.g. independent rotation about shoulder and elbow joints with Z axis motion) degrees of freedom from a simplified drive system compared to conventional drive systems. In other aspects, the drive section may provide the arm with more or less than three degrees of freedom. As seen in FIG. 1C, in one aspect the modules 56A, 56, 30*i* may be located interstitially between transfer chamber modules 18B, 18*i* and may define suitable processing modules, load lock(s), buffer station(s), metrology station(s) or any other desired station(s). For example the interstitial modules, such as load locks 56A, 56 and workpiece station 30*i*, may each have stationary workpiece supports/shelves 56S, 56S1, 56S2, 30S1, 30S2 that may cooperate with the transport arms to effect transport or workpieces through the length of the transfer chamber along linear axis X of the transfer chamber. By way of example, workpiece(s) may be loaded into the transfer chamber 416 by interface section 12. The workpiece(s) may be positioned on the support(s) of load lock module 56A with the transport arm of the interface section. The workpiece(s), in load lock module 56A, may be moved between load lock module 56A and load lock module 56 by the transport arm 26B in module 18B, and in a similar and consecutive manner between load lock 56 and workpiece station 30*i* with arm 26*i* (in module 18*i*) and between station 30*i* and station 412 with arm 26*i* in module 18*i*. This process may be reversed in whole or in part to move the workpiece(s) in the opposite direction. Thus, in one aspect, workpieces may be moved in any direction along axis X and to any position along the transfer chamber and may be loaded to and unloaded from any desired module (processing or otherwise) communicating with the transfer chamber. In other aspects, interstitial transfer chamber modules with static workpiece supports or shelves may not be provided between transfer chamber modules 18B, 18*i*. In such aspects of the present disclosure, transport arms of adjoining transfer chamber modules may pass off workpieces directly (or through the use of a buffer station) from end effector or one transport arm to end effector of another transport arm to move the workpiece through the transfer chamber. The processing station modules may operate on the substrates through various deposition, etching, or other types of processes to form electrical circuitry or other desired structure on the substrates. The processing station modules are connected to the transfer chamber modules to allow substrates to be passed from the transfer chamber to the processing stations and vice versa. A suitable example of a processing tool with similar general features to the processing apparatus depicted in FIG. 1C is described in U.S. patent application Ser. No. 11/442,511, previously incorporated by reference in its entirety.

Figure 2:
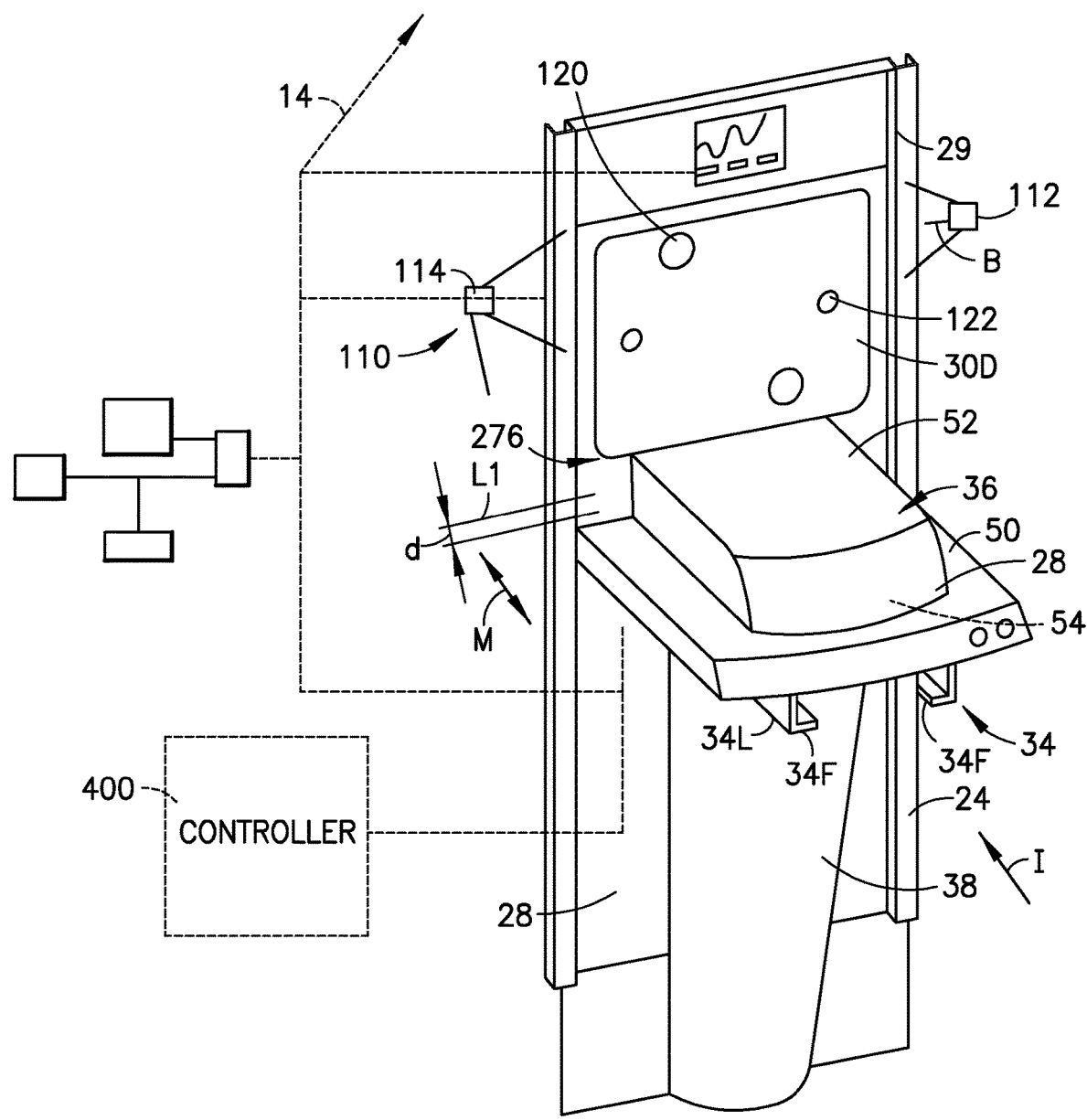
FIG. 2 is a schematic illustration of a load port module of any of the substrate processing apparatus of FIGS. 1A-1C in accordance with aspects of the present disclosure.

Referring to FIGS. 1A and 2 (which is a perspective view of the load port module 24 of the processing apparatus in accordance with this exemplary aspects of the present disclosure), the load port module 24 has a frame 29 that may generally define (as noted before) a transport container holding or support area 28 and a closable port 30P through which substrates are transported in and out of the mini-environment inside the front section housing 16. The load port module 24 may be substantially similar to that described in U.S. Pat. No. 8,821,099 entitled "Load Port Module" and issued on Sep. 2, 2014, the disclosure of which is incorporated herein by reference in its entirety. The housing 16 and load port module 24 of the EFEM are connected, as will be described further below, to form a chamber or space 25 that is substantially closed from the exterior, and as noted before, provides a controlled or mini-environment within the front section 12 (also referred to as an EFEM). For example, the front section may include a controlled air flow system (not shown), such as vents, louvers, laminar flow system, to avoid particulate contamination from entering the mini-environment in the front section 12. As seen in FIGS. 1A and 2, the transport container holding area 28 of the load port module 24 may have a primary or first station 36 and a secondary station 34. In this aspect, each station 36, 34 of the holding area 28 may be capable of holding a transport container T, though in alternate embodiments, the transport container holding area may have more or fewer holding stations, and each holding station may be capable of supporting any desired number of substrate transport containers. The transport container T (FIG. 1A) shown seated on the holding stations 36, 34 are depicted for example purposes as being front opening uniform pods (FOUPs) style containers, though in alternate embodiments, the holding stations of the load port holding area may be capable of supporting any desired type of transport container such as SMIF containers.

In the aspect shown in FIG. 1A, the front section 12 has the load port modules 24 located on the front face 12F of the front section 12 for example purposes. In this location, the load port module 24 may be positioned to facilitate placement and removal of transport containers T, onto at least one holding station 34, 36 of the load port module holding area 28, using any suitable automated material handling system (AMHS) (not shown). As seen in FIGS. 1A-2, the load port module holding area 28 projects forwards from the face 12F of the front section, and access for removal/placement, with the AMHS, of the transport containers T onto the holding area 28 may be from the top or front. In alternate embodiments, the load port module may be located on other sides of the front section as desired. In still other alternate embodiments, the load port modules may be located on two or more sides of the front section 12. As seen in FIG. 2, the load port module 24 in this exemplary aspect may have an extension zone 38 projecting outwards from the base plate of the load port module 24.

Figure 3:
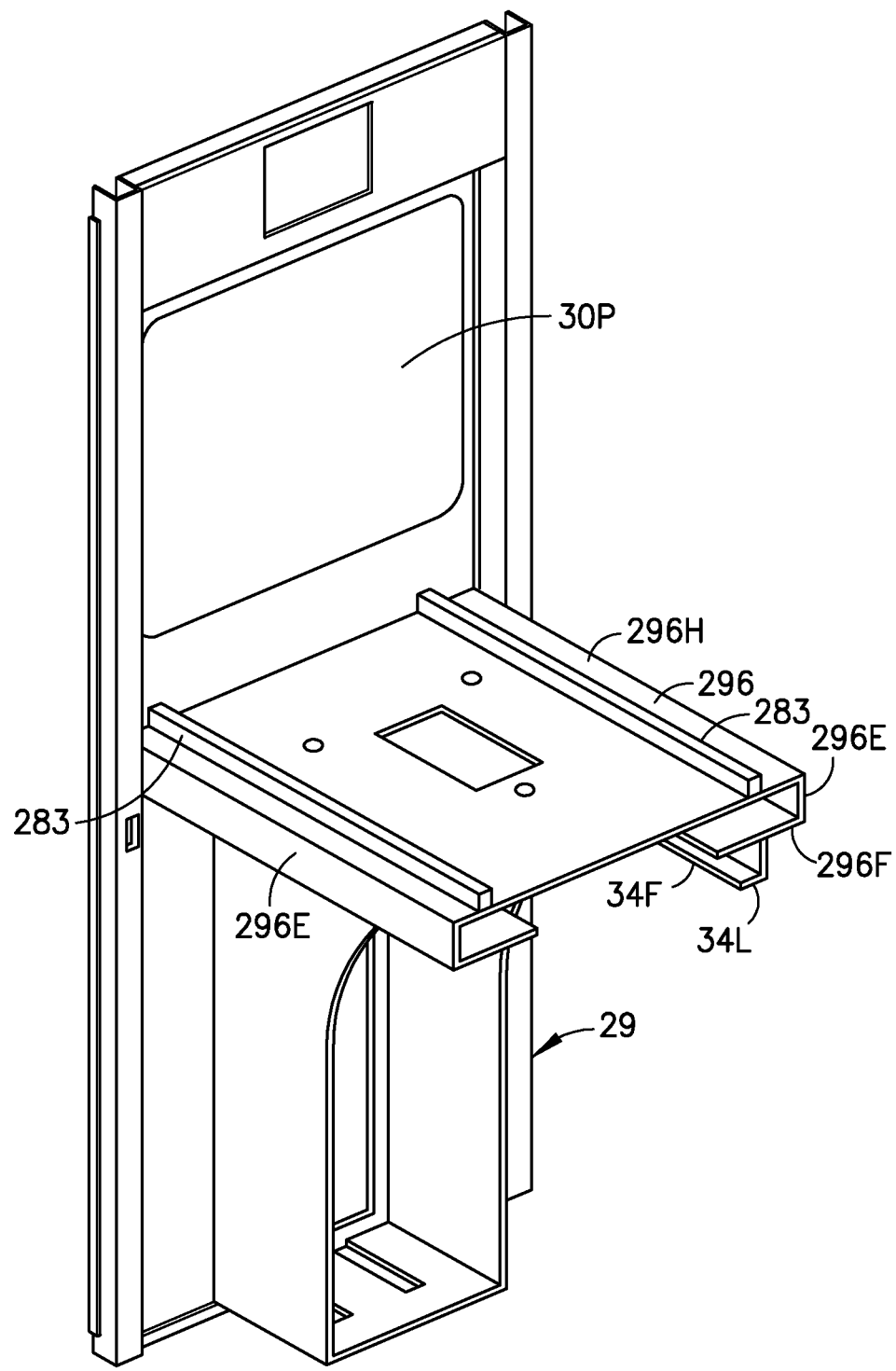
FIG. 3 is a schematic illustration of the load port module of FIG. 2 in accordance with aspects of the present disclosure.

Referring again to FIGS. 1A-3, the transport container holding area 28, of the load port module 24 may have both an upper 36 and lower 34 support station, each support station 36, 34 may be capable of holding or supporting a transport container T as shown in FIG. 1A. In this aspect, the lower station 34 is located generally under the upper station 36. The lower station 34 may comprise opposing members 34L (only one of which is shown in FIG. 3) capable of conformally engaging structure of the transport container T so that when placed in the lower station 34, the transport container is supported from members 34L. FIGS. 6A-6B respectively are front and bottom perspective views of an exemplary substrate transport container T. The container T in FIGS. 6A-6B is shown as having FOUP type configuration. In alternate embodiments, the substrate container may have any other desired configuration as seen best in FIG. 6A, transport container T generally has a casing T2 and a casing cover or door T4 removably connected to the casing. The casing T4 has an upper surface T6 with a fixture T8 projecting therefrom. The fixture T8 may include lateral flanges or outwardly projecting seating surfaces T10 that are offset a distance from the upper surface T6 of the casing. The seating surfaces T10 may be part of a handling flange conforming to SEMI; E47.1-1001. The seating surfaces T10 may serve for engaging the coupling portion (not shown) of a container transporter of an automated material handling system and thereby supporting the container from the transporter. Referring again to FIGS. 2-3, the support members 34L of the lower station 34 on the load port module holding area 28, are shown in this aspect as having an angle or general L shaped configuration. The members 34L have inward projecting flanges 34F as shown. In alternate embodiments, the support members 34L may have any other suitable shape. The support members 34L may be for example metal, plastic, or any other suitable material, and may be connected as shown in FIG. 3 to support structure 296 of the load port frame 29. The inwardly pointing flanges 34F are sized to be admitted between seating surface T10 (see FIG. 6A) on the transport container and upper surface T6 of the container. The flanges 34F of the opposing members 34L are sufficiently separated to allow insertion of support fixture T8 of the container T between the flanges with the outward projecting seating surfaces T10 overhanging (at least partially) the corresponding flanges 34F. Accordingly, when loaded into the lower station 34, the transport container T is supported by seating surfaces T10 seated on the flanges 34F.

In this aspect, the transport container T may be manually positioned by an operator on the lower station 34, by inserting the container (in the direction indicated by arrow I in FIG. 2) so that fixture T8 is moved in between flanges 34F. In alternate embodiments, the support members of the lower support station may have any other desired orientation to allow the transport container to be positioned from any other desired direction. Removal of the transport container T from the lower station 34 may be accomplished in a substantially reverse manner, with the user manually withdrawing the container in the opposite direction from installation. The lower support station 34 provides the load port module with another container stowage location where the user may place a transport container T in the case when the upper support station 36 is either occupied by another transport container or is in some state (such as testing) preventing placement of the transport container T on the upper station. As noted before, in alternate embodiments, the load port module may not have a lower support station in the transport container holding area 28.

Referring now again to FIG. 2, the upper support station 36 of the transport container holding area 28 on load port module 24, generally comprises a base support or shelf 50 and a carriage or shuttle 52 movably mounted on the shelf 50. A shuttle drive system 54 operably connects the shuttle 52 to the shelf 50 and is capable of moving the shuttle 52 on the shelf 50. The drive system 54 moves the shuttle (in the direction indicated by arrow M in FIG. 2) between a first position and a second position. As will be described further below, the shuttle 52 is configured to allow placement of a transport container T thereon. The first shuttle position may be disposed such that the transport container T may be positioned automatically on (or picked off) the carriage by the automated material handling system (not shown). The second position to which shuttle 52 may be moved, is located so that the transport container T on the shuttle may be docked to the door 30D (see FIG. 1A) as will be described further below. When the shuttle is in this second position, the transport container T thereon is located in what will be referred to for convenience purposes as the docked location. The controller 400 is communicably connected to sensors on the shuttle and the drive system as will be described further below.

As seen in FIG. 1A, the transport container T is placed on the shuttle 52 with the bottom surface of the container seated on the shuttle. The shuttle 52 is hence configured, as will be described further below to conformally engage the bottom of the transport container T. FIG. 6B is a bottom view illustrating features of the bottom T3 of the exemplary substrate transport container T. In this aspect, the bottom T3 of the transport container has features generally conforming to specification in SEMI E47.1. In alternate embodiments, the bottom of the substrate transport container may have any other desired features. In this case bottom T3 generally includes container sensing pads T12, one each of a front end of line (FEOL) and back end of line (BEOL) information pads T14, T16, a container capacity (i.e. number of substrate holding locations) information pad T18 and a box or cassette information pad T20. The container bottom T3 may further include slots T22 for engagement by locating/kinematic coupling pins 66 on the shuttle 52. A first recess T24 into the bottom surface is provided as a first retention feature. The bottom of the container also has a second retention feature T26 formed therein. The second retention feature generally comprises a generally circular recess T30 formed into the bottom that has an outer aperture T32 with substantially squared off edges T34 (forming engagement lips T36).

Figure 4A:
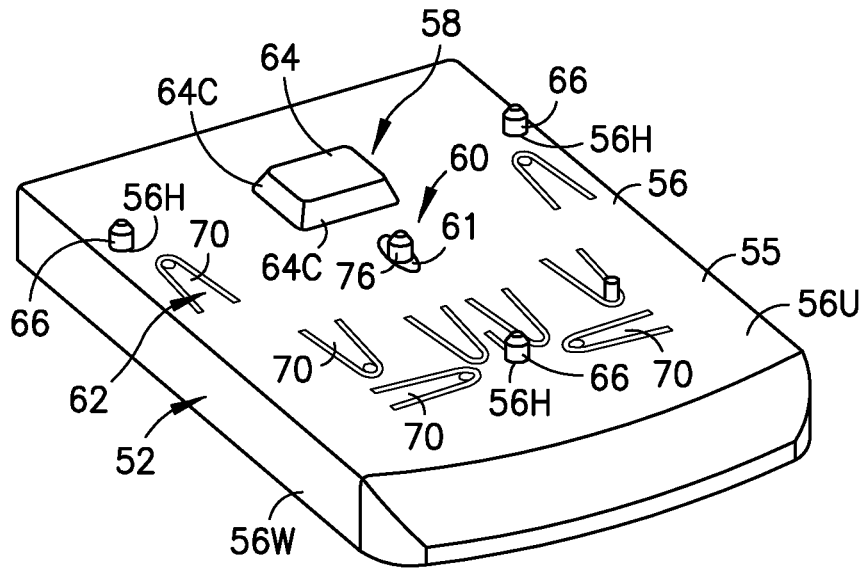
FIGS. 4A-4D are schematic illustrations of a portion of the load port module of FIG. 2 in accordance with aspects of the present disclosure.
Figure 4B:
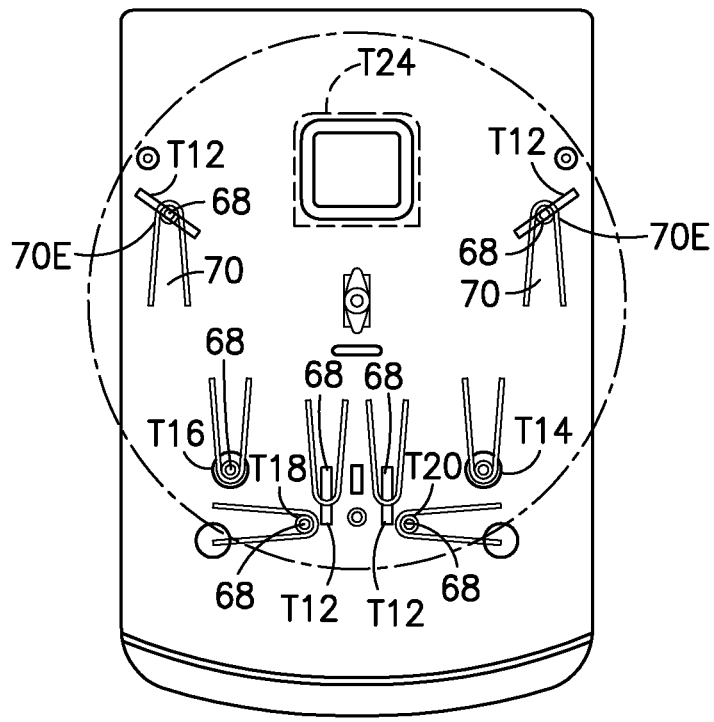
Figure 4C:
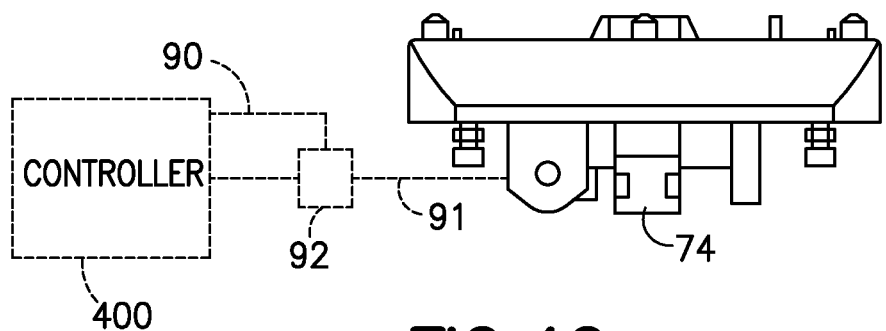
Figure 4D:
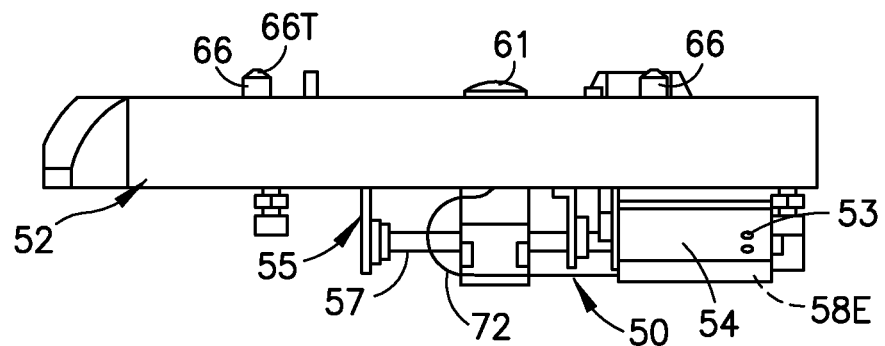

FIGS. 4A-4D, are respectively a schematic perspective, a top plan, front and side elevation views of the shuttle 52 and part of the support shelf structure on which the shuttle sits (the support shelf structure 50 is visible only in FIGS. 4C-4D). The shuttle 52 generally comprises a chassis or frame 55 and a cover 56 positioned over the chassis. The shuttle 52 may also generally have locating features 58 for helping locate the container T properly onto the shuttle, coupling features 60 for positive coupling of the seated container T to the shuttle, and detection system 62 for detecting the presence and accurate placement of the container T on the shuttle 52. Referring now also to FIG. 5, showing a partial cutaway view of the shuttle 52, chassis 55 may have any suitable shape, and may be made from any suitable material, able to support the static and dynamic loads associated with placement and removal of the transport container T on the shuttle as well as movement of the container and shuttle between the first and second positions. The chassis may have a motion system (not shown) such as rollers or slides allowing free movement of the shuttle 52 (in the direction indicated by arrow M in FIG. 2) relative to the support shelf 50 of the load port module frame. Support shelf 50, shown partially in FIG. 5, (see also FIG. 2) may be formed by support structure 296 of frame 29 (see FIG. 3). The shelf 50 may include tracks or rails (not shown), formed on or depending from frame structure 296 (for example the top plate 296H or side plates 296E) on which the motion system of the chassis 55 rides. The container locating features 58, coupling features 60, detection system 62 and cover 56 are mounted to the chassis 55.

As seen best in FIGS. 4A-4B, in this aspect container locating features 58 on shuttle 52 may include a projecting engagement member 64. In this aspect, the engagement member 64 may have a general frusto-pyramidal shape, generally conformal to the shape of locating recess T24 (see FIG. 6B) in the bottom T3 of the container. The engagement member 64, may be anchored to the chassis 55, and project through a suitable opening in the cover 56 sufficiently above the upper surface 56U of the cover to engage the locating recess T24 in the container when the container T is seated on the shuttle 52. The engagement member 64 may have cam surfaces 64C for cooperating with the edges of the container locating feature in order to aid proper automatic positioning of the container T onto the shuttle. In alternate embodiments, the shuttle may not have an engagement member like member 64. In this aspect, the shuttle 52 may have locating posts (also referred to as kinematic coupling pins) 66. Posts may serve both as locating features aiding correct positioning of the container T on the shuttle 52, as well as to provide a means of positive coupling (i.e. Kinematic coupling) the container T to the shuttle 52. As may be realized from FIGS. 4B and 6B, the posts 66 are positioned on the shuttle 52 to cooperate with slots T22 in the container bottom T3. Posts 66, which may be formed from any suitable material, such as metal or plastic, may be anchored directly to the chassis 54 of the shuttle as shown in FIG. 5. The posts 66 may project through (suitable holes in) the cover 56 to engage the bottom of the container in slots T22 (see FIG. 6B). In this aspect, the posts 66 may define the supporting plane for the transport container T on the shuttle. The ends or tips 66T of the posts may have a generally conical or rounded shape as seen in FIGS. 4D and 5. This provides the desired three contact points between the shuttle 52 and bottom of the container for precise and repeatable definition of the support plane for the container on the shuttle. As may be realized, posts 66 support the weight of the container T, and hence have a configuration, such as radial flanges shown in FIG. 5, to distribute the container weight to the chassis. The conical tops 66T of the posts 66 may also operate as caming surfaces against the inclined sides of slots T22 in the container bottom mechanically guiding the container along the support plane until the desired position (effected by the geometry of the slots T22 and the tops 66T of posts 66) of the container on the shuttle is established.

The detection system 62 of the shuttle 52 generally comprises a number of switches 68 distributed over the area of the shuttle. The switches 68 may be located on the shuttle 52 to cooperate with the container sensing pads T12, the FEOL and BEOL info pads T14, T16, the container capacity and cassette information pads T18, T20 on the bottom of the container. FIG. 4B illustrates the positions of the pads T12-T20 on the bottom of the container T overlaid on the cover 56 and switches 68 of the shuttle 52. In this aspect, the switches 68 are generally of the same type and similar to each other and will be described below with reference to a representative switch. In alternate embodiments, different kinds of switches may be used in different locations on the shuttle corresponding to the different types of information capable of being relayed to the given switch by the different information pads T16-T20 of the container T. The architecture of representative switch 68 is seen best in FIG. 5. In this aspect, switch 68 may be an electro-optic switch generally comprising a base or sensor portion 680 and an actuation portion 681. Actuation portion 681 is spring loaded as will be described further below, and is actuated by contact with a corresponding pad on the container bottom. The sensor portion 680 detects actuation of the actuation portion sending a signal to the control system. As seen in FIG. 5, sensor portion 680 may be mounted on a PCB 74 positioned on the chassis 55 of the shuttle. PCB 74 may have traces 68E formed therein for both power and signal transmission. The traces 68E may be terminated to suitable surface contacts (not shown) to which contact terminals of electronic components may be connected as desired (using any suitable means for mounting electronic components onto PCB's including flush wave soldering). The contact terminals (both power and signal) of the sensor portion 680 may be connected to the traces 68E in the PCB 74 in a similar manner. Mounting electronic components, such as the sensor portions 680 of the switches 68 to a PCB (such as PCB 74) with integral traces, serves to eliminate the individual conductors, as well as their costly and time consuming installation on the chassis, that would otherwise be used to connect the components to the power supply and control system. The traces 68E in the PCB may extend to a terminal connector (not shown) to which, for example, the connectorized end of a flexible wire harness 72 (see also FIG. 4D) may be mated. As may be realized the wire harness may link the traces 68E in the PCB 74, and hence the electronic components such as the sensor portions of the detector switches 68 to the control system 400 (see FIG. 2) and power supply (not shown). The sensor portion 680 may have for example a suitable light source such as an LED and a photo detector such as a photo cell. In the unactivated state of the switch the light source may, for example, illuminate the photo cell which causes the sensor portion 680 to send a signal (via traces 68E) to the control system 400 that is interpreted by the control system as being the inactivated state of the switch 68. Upon obstruction of the light source, such as by some portion of the actuation portion 681 of the switch, the signal from the photo cell changes which in turn is read by the control system as the switch now being in the actuated state. In alternate embodiments, the sensor portion 680 may be configured so the light source is obstructed when the switch 68 is in the inactivated state, and illuminating the photo detector when in the activated state.

As seen in FIG. 5, the actuation portion 681 of the switch 68 is integrated into the cover 56 of the shuttle 52. The spring biasing the actuation portion 681 is in this aspect formed by a portion of the cover 56. The cover 56 of the shuttle 52 may be made for example of plastic, or sheet metal or any other suitable material. In this aspect, cover 56 may be a one-piece member (i.e. of unitary construction). In the case the cover 56 is plastic, it may be formed for example by injection molding or any other suitable process. As seen in FIGS. 4A-4D, the cover 56 in this aspect may have a general hexahedron shape, with an upper surface 56U and perimeter walls 56W projecting from the upper surface. In alternate embodiments, the shuttle cover may have any other suitable shape. As seen best in FIG. 2, when mounted on the chassis 55, the cover 56 serves to substantially enclose the chassis within, with but a minor gap being provided between the bottom edge of the cover perimeter walls 56W and shelf 50 to facilitate free relative movement of the shuttle while minimizing entry of dust or other particulates into the shuttle systems. The top surface 56U of the cover has through holes 56H formed therein as shown in FIG. 4A. Holes 56H allow posts 66 to extend through the cover 56 as seen best in FIG. 5. Holes 56H in this aspect also serve to position the cover 56 onto the shuttle chassis 55 as also shown in FIG. 5 (the clearance between the hole edge and corresponding post 66 is sufficiently small, so that the post 66 provides accurate positioning of the cover 56 relative to chassis 55. Further, in this aspect the rims of the holes 56H are seated on collars 66C of the posts 66, as shown in FIG. 5, thereby supporting the cover 56 from the posts. In alternate embodiments, the cover may have any other desired mounting system for attaching the cover and chassis. As seen in FIGS. 4A-4B, the upper surface 56U of the cover has a number of resiliently flexible tabs or fingers 70 formed therein. The tabs 70 may be formed by any suitable means such as cutting the top surface 56U of the cover 56. The number of tabs 70 may coincide with the number of switches 68 of detection system 62. In this aspect, there are eight tabs 70 formed into the upper surface of the cover. In alternate embodiments, the cover may have any other desired number of flexible tabs formed therein. In other alternate embodiments, flexible tabs may be formed in any other desired surface of the cover. In the aspect shown in FIGS. 4A-4B, the tabs 70 are substantially similar to each other, and hence, tabs 70 may have similar resiliently flexible characteristics. In alternate embodiments, the shape (i.e. length, cross-section) of different tabs may vary to provide the different tabs with different flexibility characteristics. In this aspect, the tips 70E of the tabs 70 are located on the cover so that when the cover is mounted to the chassis each tip 70E is positioned substantially over the sensor portion 680 of the corresponding switch 68 (see FIG. 5). In alternate embodiments, the tabs may be placed so that any other desired portion of the tab (i.e. the tab mid-section) is positioned over the sensor portion of the corresponding switch. The tab orientation on the upper surface 56U of the cover may be otherwise selected as desired to provide the tab with the flexibility of an unrestrained cantilever. The orientations of tabs 70 shown in FIGS. 4A-4B are merely exemplary, and the tabs may have any other desired orientation.

As seen best in FIG. 5, in this aspect the actuation portion 681 of the switch 68 is mounted or located on the tip 70E of the corresponding tab 70. The actuation portion 681 may be of unitary construction with the tab 70 (formed for example during the molding process of the cover upper surface) or may be mounted to the tab 70 with suitable bonding means such as adhesive. The actuation portion 681 projects sufficiently from the upper surface 56U of the cover to come in contact with the corresponding pads T12-T20 of the container placed on posts 66, and by this contact generate sufficient deflection of the tab 70 to move the interrupter flag portion 68F of the actuation portion to (e.g. obstruct the light source and) cause activation of the switch 68. When the container T is removed from the shuttle 52, the flexible tab 70 resiles back to the undeflected position returning the switch to the inactivated state. As may be realized, if the container T is not properly placed on the shuttle, there may be some misalignment between pads T12-T20 of the container and at least some of the actuation portions 681 of the switches 68 so that at least some of the switches do not activate. The signal combination of some switches activated and others not, may be interpreted by the control system 400 as an indication of improper placement of the container T on the shuttle. The control system programming may then prevent motion of the shuttle 52 and command corrective action to correct placement or removal of the container from the shuttle.

As noted before, shuttle 52 may have a coupling feature 60 for positive coupling of the transport container T to the shuttle. As also noted before, posts 66 serve as kinematic coupling means between the shuttle and container during shuttle motion. In this aspect, the shuttle coupling feature 60 may also include a container clamping system 61 substantially similar to that described in U.S. Pat. No. 8,821,099 previously incorporated by reference herein in its entirety.

Referring now again to FIGS. 2 and 4A-4D, shuttle 52 may be moved (in the direction indicated by arrow M in FIG. 2) between the first or loading position and the docked position of the shuttle by drive system 54. As seen best in FIGS. 4C-4D, the shuttle drive system 54 in this aspect generally comprises an electric motor 53 driving a lead screw 57. In alternate embodiments, the shuttle may have any suitable type of drive system such as a pneumatic or hydraulic drive system. The electric motor 53 in this aspect may be any suitable type of motor such as an A.C. or D.C. motor, a stepper motor or servo motor. Motor 53 may be fixedly mounted to the shelf structure 50. The lead screw 57 is connected to the output shaft of the motor. The motor may be capable of rotating the lead screw both clockwise and counterclockwise. The lead screw 57 is also drivingly engaged to the chassis 55 of the shuttle 52 which rides along linear bearing(s) 283 (FIG. 3). Engagement between the lead screw and chassis may be provided by any suitable means such as for example a threaded bushing fixed to the chassis and threadably engaged by the lead screw. Rotation of the lead screw 57 by motor 53 results in axial motion of the bushing over the lead screw, and hence of the chassis and shuttle 52 relative to the shelf 50 to which the motor 53 is fixed. As seen in FIG. 4C the motor 53 is communicably connected to the controller 400 by a suitable circuit 91. The controller 400 may provide both command signals and power (from a suitable power supply) to motor 53 over circuit 91. The motor 54 may include a motor encoder 58E (see FIG. 4D) for sending position indication data to the controller. The controller 400 may be capable of processing the motor encoder data to identify the position of the shuttle on the load port. In alternate embodiments, a linear encoder may be mounted between the shuttle and support shelf to identify the shuttle position during movement. As seen in FIG. 4C, in this aspect circuit 91 may also include a pinch protection circuit 90 capable of detecting an obstruction to shuttle motion. The pinch protection circuit may include a current sensor 92, of any suitable type, and of desired sensitivity capable of measuring current changes to motor 53. The current sensor 92 is configured as desired to monitor the current supplied to motor 53 through circuit 91. Measurement signals from the sensor 92 are transmitted by circuit 90 to the controller 400. The pinch protection circuit 90 may be a closed loop or open loop system as desired. As may be realized, when the shuttle is being advanced by the drive motor 53 and encounters an obstruction, the current supplied the motor (via circuit 91) increases in general proportion to the level of resistance to shuttle motion provided by the obstruction. The "excess" current is detected by sensor 92 and the information is relayed to the controller 400 via circuit 90. The sensor 92 may be capable of sending raw or unprocessed sensor data to the controller 400. The controller may be programmed (such as a suitable algorithm) to process the data from the sensor to identify, from noise, when excess current, of sufficient level and of sufficient duration to indicate an obstruction, is being supplied to the motor 53. Controller 400 has an auto-reverse program 402 (see FIG. 1A) wherein upon identification of the excess current (and hence of the obstruction to shuttle motion) the controller sends a command signal to motor 53 stopping the previously commanded operation and reversing the motor direction. The rotation of the lead screw 57 effecting movement of the shuttle 52 is thus also reversed thereby causing the movement of the shuttle to be reversed away from the obstruction. The shuttle may be reversed a predetermined distance established from encoder 53E information. In alternate embodiments, the current sensor 92 may be programmable to select desired set points for detecting the excess current. In this case, the current sensor may send a suitable signal to the control upon detection of an excess current having a level and duration exceeding the programmed set points. Upon receiving the signal from the current sensor, the controller accesses the auto-reverse program 402 in the controller memory. This provides superior obstruction detection and recovery system at a lower cost than conventional systems that employ a deflectable (i.e. pinch) bar.

Referring now again to FIG. 2, the load port module in the aspect shown may have transport container advance detection system 110 (depicted schematically in FIG. 2). The container advance detection system 110 is a non-contact system to detect a feature of a container T mounted to and being advanced by the shuttle 52 and effect stopping the shuttle so that when the container is in the docked position the front face of the container is in a desired repeatable location regardless of the tolerance variations between different containers. It is desirable to stop the load port shuttle advance motion so that there is a minimum clearance between the container and the load port frame 29 without actual contact between them. Since container dimensions will vary, especially between manufactures, in conventional systems the shuttle movement is generally adjusted for "worst case", allowing an overly large clearance in most instances. The container advance detection system 110 of the load port module 24 overcomes the problems of conventional systems allowing different containers to be stopped with the front face at location L1 providing minimum clearance. The detection system 110 in this aspect has a "thru beam" sensor configuration with an emitter or source of radiating energy and a detector for detecting the radiating energy from the emitter. For example, in this aspect the detection system 110 may have a light source 112, such as a LED or laser diode on the terminal end of an optical fiber connected to a suitable remote light source. The system 110 may also have a suitable light sensing portion 114 such as a photo cell for sensing the light beam from the source 112. As seen in FIG. 2 the light source 112 and sensor 114 are positioned on opposite sides of the shuttle 52 and at a desired height so that the container T mounted and transported by the shuttle 52 will break the light beam B emitted by the source 112 and illuminating at least the sensing part of sensor 114. Though not shown in FIG. 2, the light source 112 and sensor 114 may be housed in suitable covers for contact and particulate protection and to prevent inadvertent interruption of the beam by objects other than the container transported by shuttle 52. As seen in FIG. 2, the sensors 112, 114 are positioned at an offset distance in the direction of shuttle travel (indicated by arrow M in FIG. 2) so that the light beam B is spaced a desired distance d from the location L1 of the front face of the container T when brought to the docked position by the shuttle. As may be realized, the front face of the container T advanced by the shuttle, breaks the beam B when at distance d from the docked position location L1. The controller 400 is programmed with distance d. The controller 400 is also programmed with an algorithm (program module 401 in FIG. 1A) that uses shuttle movement information, such as may be provided to the controller by motor encoder 53E (see also FIG. 4D), and the distance d to determine when shuttle advance movement is to be stopped so that the front face of the container T on the shuttle is at location L1. Hence, when the front face of the advancing container T breaks beam B, the sensor 114 sends a suitable signal to the controller 400 informing the controller of the detection of the container front face. The controller 400 then may determine when to command the shuttle advance to stop as noted above, and sends the command to the shuttle drive section 54 at the correct time. In this manner, each container T transported by the shuttle is appropriately positioned in its docked location to have the container front face at location L1 regardless of the dimensional variation between containers.

With the container T in the docked position, as shown in FIG. 1A, the door T4 of the container may be engaged by the door 30D of the load port module access port 30P. The door T4 in the front face of the container T is schematically illustrated in FIG. 6A. The door T4 may include latch systems T40, T42 that when engaged retain the door T4 in the container box. Examples of the latch systems for the container door are disclosed in U.S. Pat. No. 5,772,386, issued Jun. 30, 1998 and incorporated by reference herein in its entirety. The door latch systems T40, T42 may include a pivotable hub T44, to which the latch tabs T46 may be articulately linked. Rotation of the hub T44 causes actuation of the latch tabs T46 to engage and disengage the container housing. The latch hub T44 is accessible through latch key access holes T50 in the door T4. The container door T4 may also have locator pin holes T52 as shown in FIG. 6A. Referring again to FIG. 2, the access port door 30D of the load port module has locator pins 120 and latch keys 122 in a complementary or matching configuration to the locator pin holes T52 and latch key access holes T50 in the door T4 of the container. The locator pins 120 and latch keys 122 in port door 30D may be similar to locator pins and latch keys in U.S. Pat. No. 5,772,386 (previously incorporated by referenced herein). The latch keys 122 of the port door 30D conform to the shape of the key access holes T50 in the container door and key hole in the hub T44 of the latching system. When the port door 30D engages the container door T4, the latch keys 122 on the access door 30D enter through key access holes T50 into the key holes formed in the hub T44 of the container. Rotation of the latch keys 122 causes rotation of the hubs T44 and actuation of the latch systems to engage/disengage the latch tabs thereby locking or unlocking the container door T4 from the container. The latch keys 122 are rotatably mounted in the access door structure and are operated in a manner substantially similar to that described in U.S. Pat. No. 8,821,099, the disclosure of which was previously incorporated herein by reference in its entirety.

Figure 7A:
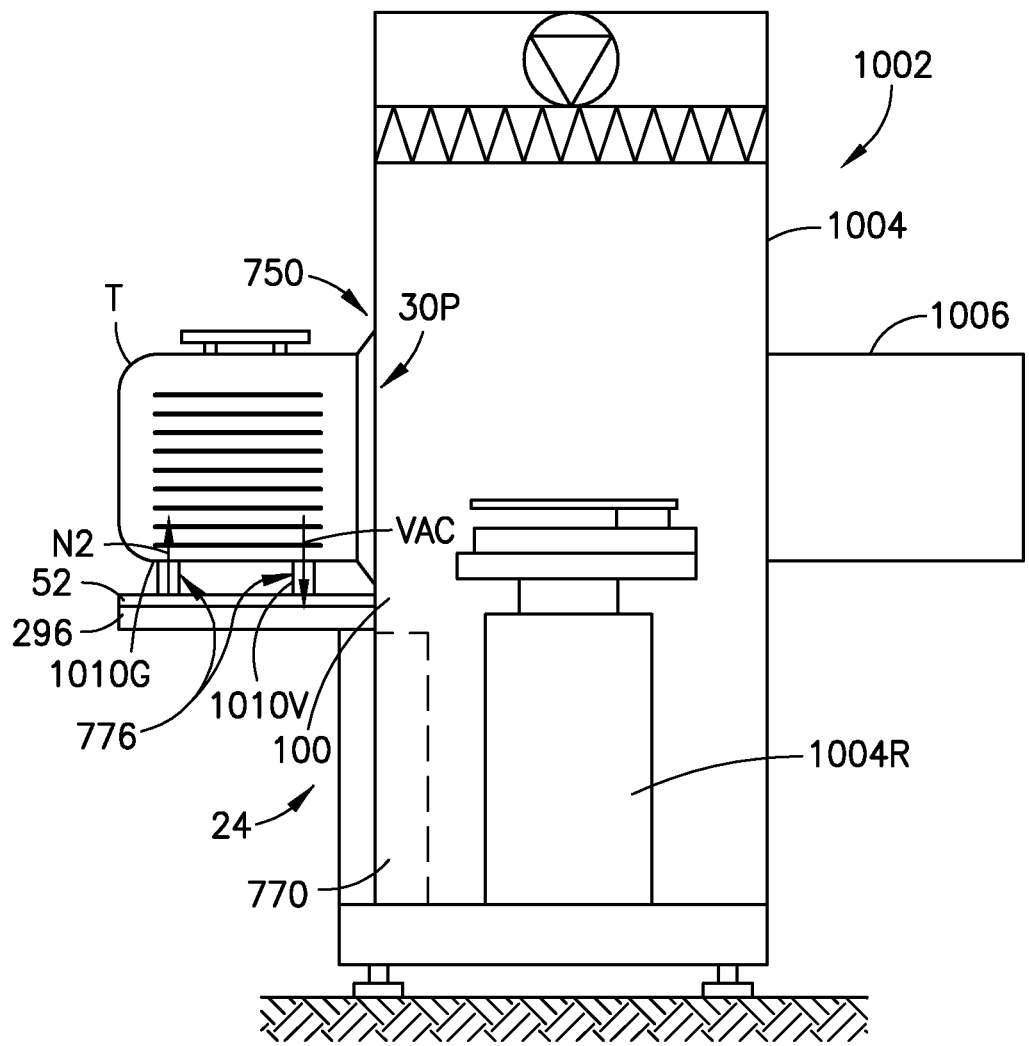
FIGS. 7A and 7B are schematic illustrations of a portion of the substrate processing apparatus of any of FIGS. 1A-1C in accordance with aspects of the present disclosure.
Figure 7B:
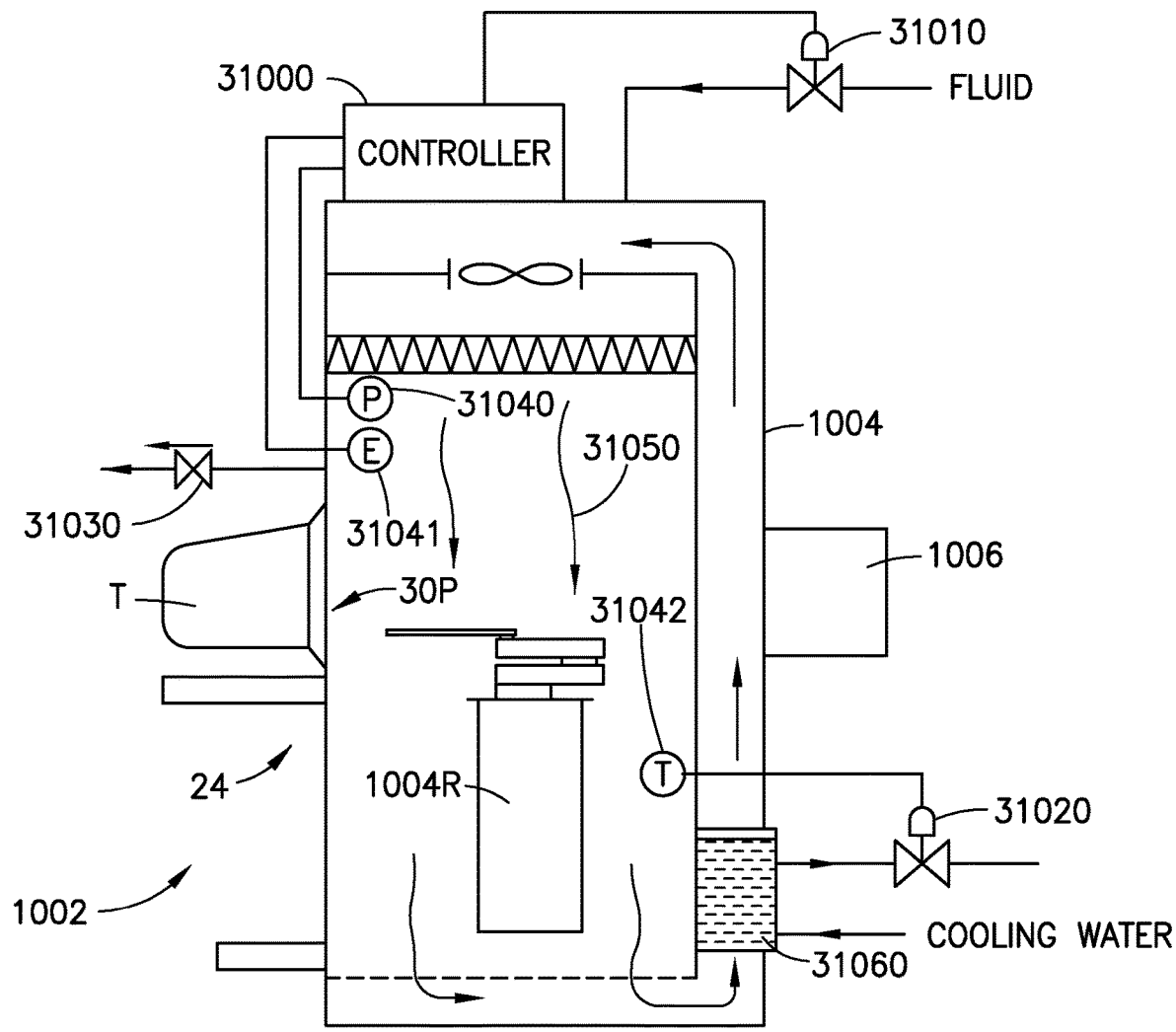

Referring now to FIGS. 7A and 7B, there is shown schematic elevation views of a substrate processing apparatus or tool 1002 and container(s) T connected thereto in accordance with another exemplary embodiment. The processing apparatus 1002, in the exemplary embodiment shown in FIG. 7A, is generally similar to the substrate processing tools illustrated in FIGS. 1A, 1B, and 1C. The process tool 1002 may generally have a process section 1006 and EFEM 1004 (continuing, for explanation purposes only, with the reference convention in which wafers may be considered to be loaded into the tool from the front). In the exemplary embodiment, the process section 1006 and EFEM 1004 may share a common controlled environment or atmosphere (e.g. inert gas (N2), (Ar), or very clean dry air). The process section 1006, is shown schematically, and may include one or more process sections or module(s) connected to the EFEM 1004 (the arrangement shown in FIG. 7A is merely exemplary and the EFEM and process section module(s) may be connected to each other in any desired arrangement in alternate embodiments). The process section(s) or module(s) 1006 may be capable of being isolated from the EFEM 1004, such as with a closable opening (e.g. a gate valve). Accordingly, the process section may also be provided with a different process atmosphere than the EFEM atmosphere. In alternate embodiments, the process section 1006 may include a load lock allowing process modules with dissimilar atmospheres or holding a vacuum to be connected to the EFEM as will be described further below.

The EFEM 1004 in the exemplary embodiment shown in FIG. 7A, may be similar to those described above except as otherwise noted. The EFEM 1004 may include suitable environmental controls to maintain a desired controlled environment or atmosphere in the EFEM when substrate are transported to and from the process section 1006. For example, the EFEM 1004 may include a controller 31000 (which may be substantially similar to controller 400 described above), one or more fluid control valves 31010, 31020, a pressure relief or check valve 31030 and sensors, such as for example, pressure sensor 31040, contamination sensor 31041 and temperature sensor 31042. The controller may be configured to adjust or regulate attributes such as the temperature pressure and rate of gas flow 31050 of the controlled environment within the EFEM (and process section 1006). For example, the controller 31000 may receive signals from the pressure sensor 31040, temperature sensor 31042 and environmental contamination sensor 31041. Depending on the environmental information in those signals the controller may release or increase pressure within the EFEM, increase or reduce air flow 31050 within the EFEM by actuating the appropriate valves 31010, 31030. The controller 31000 may also be configured to increase or decrease the temperature of the gas within the EFEM (e.g. via adjusting coolant flow through radiator 31060) based on temperature readings provided by temperature sensor 31042. As may be realized, while the controller 31000 and associated valves and sensors are described with respect to FIGS. 7A and 7B, the controller 31000 may be used to control the environment(s) of the other embodiments disclosed herein.

The EFEM 1004 may include a substrate transport apparatus or robot 1004R (the robot, as may be realized, may be of any desired type) capable of holding and transporting substrates. Similar to that described above, the EFEM 1004 may include the load port 24 (as described herein) for interfacing one or more container(s) T to the tool 1002, and allowing substrates to be loaded and unloaded to and from the tool 1002. The load port 24, of the EFEM 1004, and a corresponding complementing interface portion of the container(s) T (as described herein), may be configured to enable loading and unloading of substrates between container and EFEM without degradation of the controlled environment in the EFEM 1004 and process section 1006. The EFEM load port 24, and complementing interface portion of the container T, which may be collectively referred to as the container To EFEM interface, may be arranged so that container(s) T interfaced to the EFEM, are integrated into the tool. By way of example, the container(s) T so integrated via the load port 24, may define a chamber(s) sharing the same controlled atmosphere as the EFEM, and thus capable of holding substrates in the same controlled atmosphere as the EFEM, so that substrates may be transported directly from container T to process section or process module by the EFEM transport robot 1004R. Similar to the aspects of the present disclosure described before, the container to EFEM interface in the exemplary embodiment shown in FIG. 7A, defines what may be referred to before as a clean tunnel (with substantially the same cleanliness as throughout the EFEM and process section) from within the container chamber, through the interface into the EFEM, and throughout the process section. The clean tunnel may be closed (such as when the container(s) is removed from the load port), and opened freely without degradation to the clean tunnel. In the aspect shown in FIG. 7A, the container to EFEM interface may also be arranged to enable direct integration of the container T with the tool (substantially as described above) independent of container environment prior to interface, in a manner substantially similar to that described in U.S. Pat. No. 9,105,673 entitled "Side Opening Unified Pod" and issued on Aug. 11, 2015, the disclosure of which is incorporated herein by reference in its entirety. Thus, in the aspect illustrated in FIG. 7A, the container(s) T may be interfaced with and integrated directly to process tools having different or dissimilar environments (e.g. clean air to inert gas environment, or clean air to vacuum) and then transport directly between tools with different dissimilar environment and interfaced and integrated again with the tools as will be described further below. Accordingly, a substrate(s) at one tool with a controlled environment may be transferred directly with the EFEM robot 1004R, from the process section (similar to process section 1006) through the clean tunnel into the container(s) T, the container(s) T transported directly and interfaced to the EFEM (similar to EFEM 1004) of another tool possibly with a dissimilar/different controlled environment, and the substrate(s) transferred directly with the EFEM robot through the clean tunnel now defined in the other tool to the process section without degradation of the controlled environment in the other process tool. In effect, the container to EFEM interface in combination with the container may be considered to define an exterior load lock, or container load lock.

Referring still to FIG. 7A, in the aspect illustrated in FIG. 7A, the load port 24 is shown interfacing with one container T for example purposes, though in alternate embodiments, the load port may be arranged to interface with any desired number of containers. For example, in alternate aspects, the load port may have a generally stacked configuration capable of interfacing a number of containers arrayed in a stack similar to that described in U.S. Pat. No. 9,105,673, the disclosure of which has been previously incorporated by reference herein in its entirety. In accordance with the present disclosure, the load port 24 may have a vacuum source 1010V capable of being communicably connected to the container(s) T held on the load port in order to pump down the container, for example to clean molecular contaminants from the container interior and substrates therein when the container is on the load port. Conversely, the container may be arranged in any suitable manner to communicably interface with the vacuum source 1010V at the load port and to withstand atmospheric pressure in the container casement when the container is pumped down to vacuum, such as described in U.S. Pat. No. 9,105,673.

The container T may have suitable passages and orifice(s) or ports 776 (which may be vacuum ports, purge gas ports, or the ports may be common to both vacuum and purge gas sources) so that, on connection or coupling the container with the load port 24, the vacuum source 1010V of the load port is automatically coupled to the container housing and communicates with the container interior. As described herein, coupling of the container T to the vacuum source 1010V and/or actuation of the vacuum source 1010V when coupled to the container T may cause corrosive gas egress 910, 920, 930 (FIG. 9) from the container T, such as at the coupling and/or through a door seal of the container T. The location of the ports 776 shown in FIG. 7A is merely exemplary, and in alternate embodiments the vacuum port may be positioned as desired. As may be realized, container seals (see, e.g., door seal 940 in FIG. 9) have desired integrity to withstand vacuum across the seal.

As seen in FIG. 7A, in the exemplary embodiment illustrated, the container T may also be configured to be communicably connected to a gas feed, such as a source of vent or purge gas. In the exemplary embodiment shown in FIG. 7A, the container T may be communicably connected to gas source/feed 1010G, when seated on the container support of the load port 24. As may be realized, the container T may have a suitable inlet port 776 (plug (and suitable gas channels connecting the container interior) to couple (for example automatically) to a nozzle of the gas feed 1010G, such as when the container is placed on the load port support surfaces. As described herein, coupling of the container T to the gas source 1010G and/or actuation of the gas source 1010G when coupled to the container T may cause corrosive gas egress 910, 920, 930 (FIG. 9) from the container T, such as at the coupling and/or through a door seal of the container T. The arrangement of the gas source interface between load port and container shown in FIG. 7A is merely exemplary and in alternate embodiments the gas source interface between container and load port may have any other desired location and configuration. As noted before, the gas source 1010G may be capable of providing for example purge and/or vent gas to the container seated on or located at the load port 24. By way of example, with the container T suitably positioned (such as from an overhead transport) at load port 24, and the gas feed nozzle connected to the container to feed gas into the container housing, a purge gas (e.g. N2) may be fed into the container if desired (depending on the interior atmosphere of the container when positioned at the load port, and the environment being maintained in the EFEM). Thus, if the container for example contains some process atmosphere, (such as from an interface with a previous tool), and the EFEM 1004 may be maintained with an inert gas or very clean air atmosphere, that may be dissimilar from the container atmosphere, upon positioning the container at the load port, desired purge gas may be fed into the container such as via gas feed 1010G, purging the container atmosphere so that the container may be interfaced with the load port opening and integrated to the tool 1002 is previously described. Moreover, in the event that container atmosphere is considered incompatible with or possibly presenting undesired contaminants to, the EFEM environment, upon positioning the container at the load port (but for example before opening the container interior to the EFEM environment), the container interior may be pumped to sufficient vacuum via vacuum source 1010V, and filled with the inert gas (e.g. N2, very clean air) similar to the environment in the EFEM to clean the potential contaminants from the container T, and allowing integration of the container T to the tool as previously described. As may be realized, one or more of the ports 776 may be coupled to the vacuum source 1010V and one or more other ports 776 may be coupled to the purge gas source 1010G to effect purging of the container T.

As noted above, the purge gas feed 1010G may, in addition to or in lieu the vacuum source 1010V, operate the actuator 5000 in a manner substantially similar to that described above. Information regarding the container atmosphere may be recorded on a RFID (radio frequency identification) tag, or other suitable data storage device, capable of being read (or otherwise accessed) by a suitable reader at or proximate to the load port 24 with which the container is being loaded. Accordingly, suitable information regarding the container interior may be obtained by the tool controller, reviewed with a desired protocol and if desired the container may be pumped and vented as previously described when positioned at the load port 24. Information regarding the container atmosphere for example may be recorded on the container borne storage device when the container is docked to the load port, or any other suitable time. Such information may also be tracked by a FAB wide controller if desired. As may be realized, the container T may also be interfaced with a EFEM that may not have vacuum and gas feed connections. In alternate embodiments, the container may include an internal or onboard source of purge gas, such as described in U.S. Pat. No. 9,105,673, to effect purging the container when positioned at a load port. As may be realized, in other aspects, the load port interface interfacing with the container may be provided with a vacuum connection, and no gas feed, that gas being provided for example from a gas source on board the container. Thus, as may be realized the container may now serve as a substrate cleaning chamber of the tool, storing substrates at the tool so they are undergoing cleaning. As may be realized, the container pump/vent may also be performed prior to removal of the container T from the load port 24 such as when repositioning the container T to another tool.

As noted before, the arrangement of the load port and container to tool interface shown in FIG. 7A is merely exemplary, and in other aspects, the interface may have any other desired configuration. For example, the gas feed may be positioned as desired to vent gas from EFEM environment into the container after the container interior has been pumped.

Figure 9:
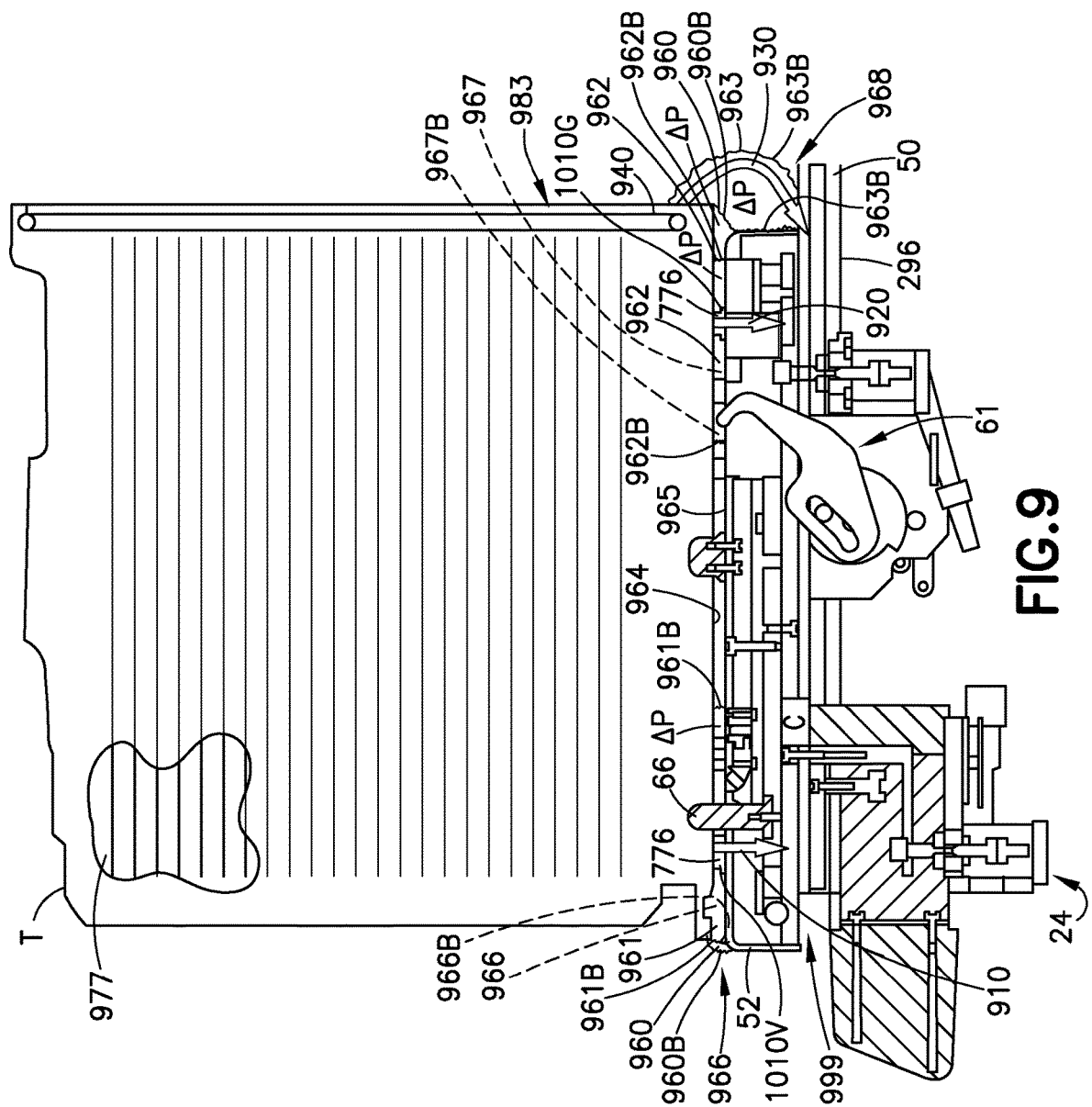
FIG. 9 is a schematic illustration of a portion of the load port module of FIG. 2 in accordance with aspects of the present disclosure.
Figure 10A:
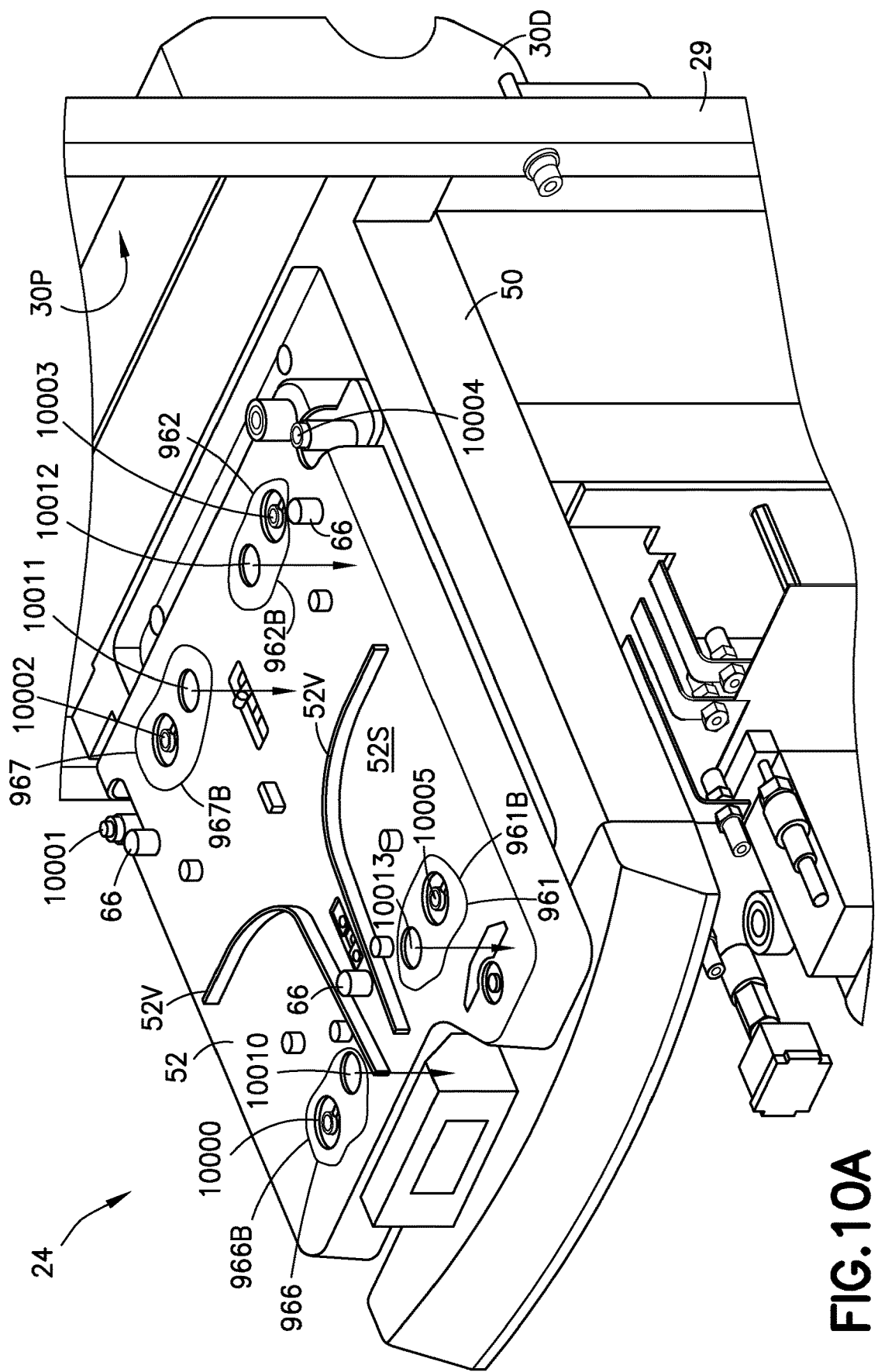
FIG. 10A is a schematic illustration of a portion of the load port module of FIG. 2 in accordance with aspects of the present disclosure.
Figure 10B:
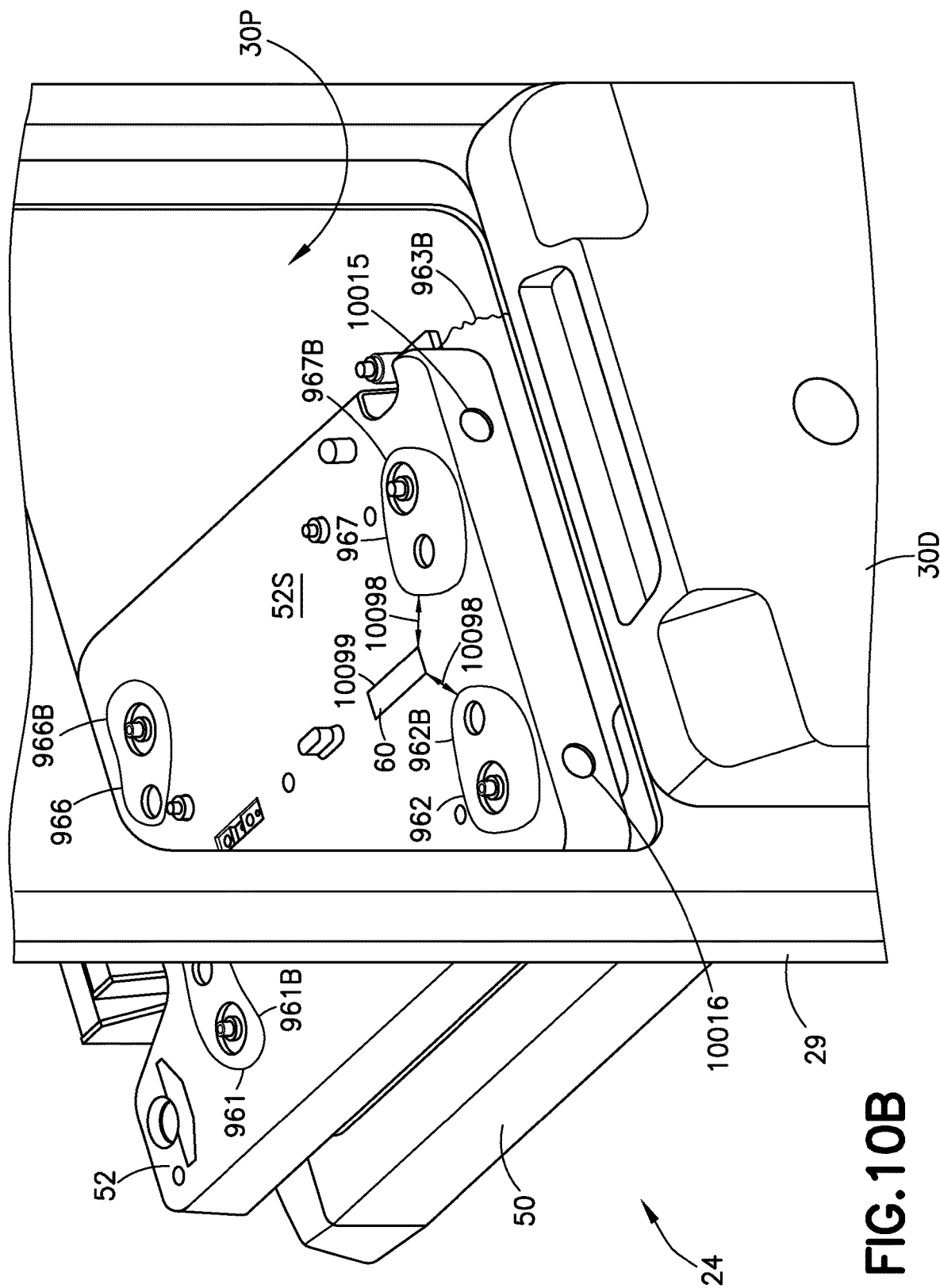
FIG. 10B is a schematic illustration of a portion of the load port module of FIG. 2 in accordance with aspects of the present disclosure.
Figure 11:
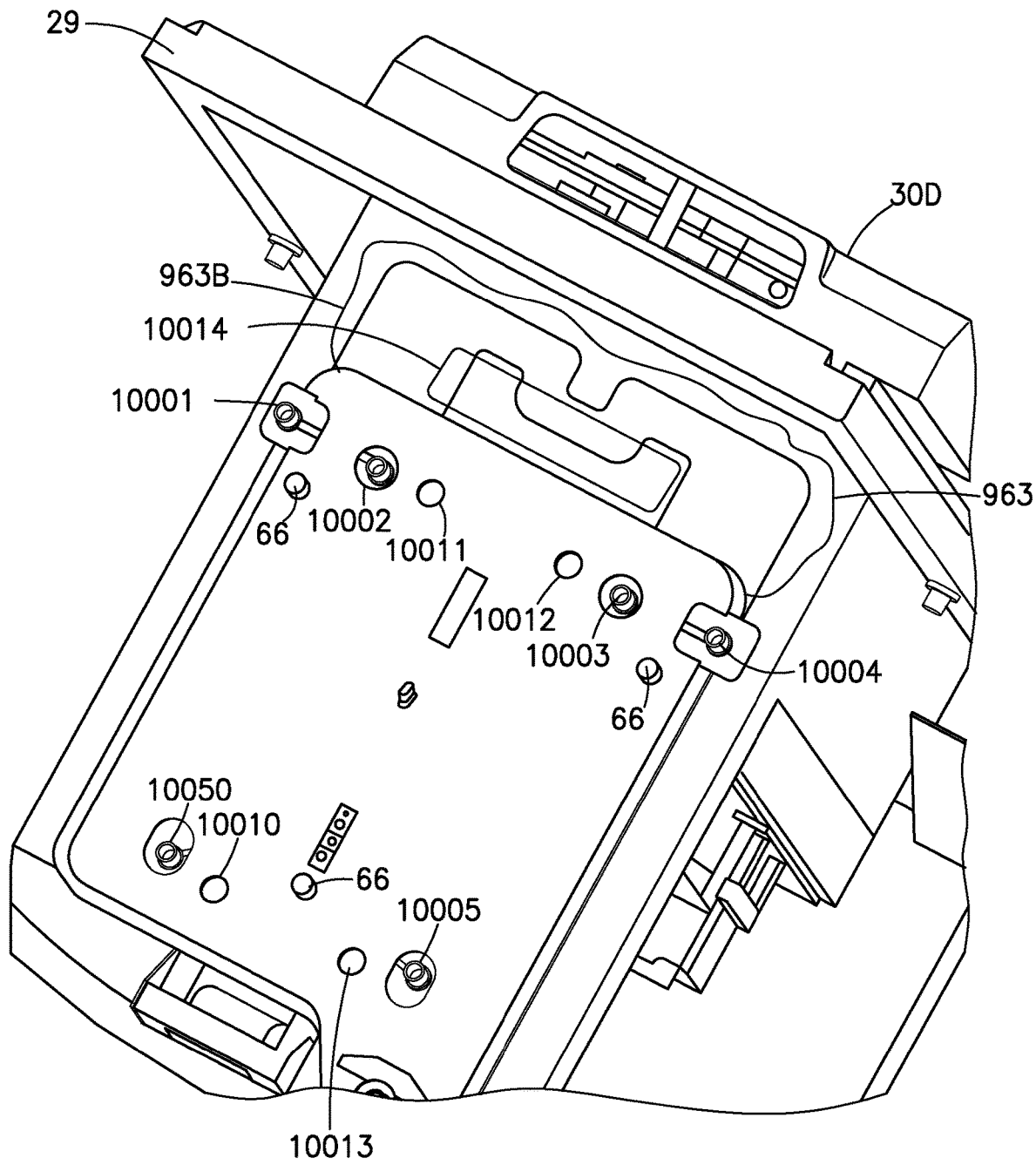
FIG. 11 is a schematic illustration of a portion of the load port module of FIG. 2 in accordance with aspects of the present disclosure.

Referring to FIGS. 9-11, as described above, placement of the container T on the load port 24 (or removal of the container T from the load port 24) may cause corrosive gas egress 910, 920 from the container T at, for example, the purge/vent port couplings 10000-10005, where the purge/vent port couplings 10000-10005 are substantially coupled to the ports 776 (e.g., predetermined access locations, also noting that the container door 30D to container T interface 983 may also be considered a predetermined access location) on the container T. Corrosive gas egress 930 may also occur at/from a door seal 940 (FIG. 9) such as where the door seal 940 is worn or the interior of the container T is over pressurized. There may be a slit or small opening 999 between, for example, the shuttle 52 and the shelf 50 that may allow fluidic access to, e.g., printed circuit boards (PCBs) 74 (FIG. 5), linear bearing(s) 283 (FIG. 3), motors (see e.g., motor 53 (FIG. 4D), sensors (see sensors T12-T20 (FIG. 4B), sensor 680 (FIG. 5), switches 68 (FIG. 5), sensor 92 (FIG. 4C)), wire harness(es) 72 (FIG. 4D), detection system(s) 110 (FIG. 2), and/or other suitable components of the load port 24. In accordance with aspects of the present disclosure, and as described herein, at least one continuous steady state differential pressure plenum region 960-963 (also referred to as continuous steady state fluid mass flow plenum region(s)) may substantially prevent corrosive gas egress through the slit 999 and substantially prevent corrosive gas contact with, for example, the suitable components of the load port 24 including, but not limited to, printed circuit boards (PCBs) 74 (FIG. 5), linear bearing(s) 283 (FIG. 3), motors (see e.g., motor 53 (FIG. 4D), sensors (see sensors T12-T20 (FIG. 4B), sensor 680 (FIG. 5), switches 68

(FIG. 5), sensor 92 (FIG. 4C)), wire harness(es) 72 (FIG. 4D), detection system(s) 110 (FIG. 2), and/or other suitable components of the load port 24 that are in proximity of the container T disposed on the load port 24. As also noted above, the at least one continuous steady state differential pressure plenum region 960-963 may alleviate costs, modifications, manufacturing complexity, and manufacturing lead time associated with coatings being applied to the load port components. In one aspect, the controller 400 is configured to control a fluid mass flow of the continuous steady state differential pressure plenum region 960-963 depending on a configuration of a container T held by the load port 24. For example, the controller 400 may adjust the fluid mass flow in any suitable manner to enlarge or reduce an area covered by the continuous steady state differential pressure plenum region 960-963 (e.g., change a location of the fluid flow boundaries) so that the area covered encompasses a purge port 601-604 (FIG. 6B) configuration of the carrier T coupled to the load port 24 (e.g., where the purge port configuration may change from container to container and/or from container manufacturer to container manufacturer).

As described above, the load port module 24 includes the frame 29 that is adapted to connect the load port module 24 to the substrate processing apparatus (such as those described above. The transport container holding area 28 connected to the frame 29 for holding at least one substrate cassette container T proximate the access port/transport opening 30P of the load port module 24. The transport container holding area 28 is configured so that a sealed internal atmosphere 977 of the at least one substrate cassette container T is accessed from the transport container holding area 28 at predetermined access locations (e.g., such the ports 776) of the at least one substrate cassette container T. The transport container holding area 28 has a predetermined continuous steady state differential pressure plenum region(s) (see different pressure plenum regions 960, 961, 962, 963, 966, 967 in FIGS. 9, 10A, and 10B, and continuous steady state differential pressure plenum region 963 in FIGS. 9, 10B, and 11) disposed on the transport container holding area 28 that are located exterior to the EFEM and outside the load port opening 30P (e.g., exterior to the BOLTS interface between the load port module 24 and the EFEM 12.

The predetermined continuous steady state differential pressure plenum region(s) is/are determined at least in part by boundaries 960B, 961B, 962B, 963B, 964, 965, 966B, 967B of fluid flow generating differential pressure, so that the predetermined continuous steady state differential pressure plenum region(s) defines a continuous steady state fluidic flow isolation barrier 968 (also referred to as a continuous steady state isolation barrier of fluid flow) disposed on the transport container holding area 28 between the predetermined access locations (e.g., ports 776) of the at least one substrate cassette container T and another predetermined section (e.g., such as the sections/portions of the load port module 24 that may be susceptible to corrosion) of the transport container holding area 28 isolating the other predetermined section from the predetermined access locations. In one aspect, the continuous steady state fluidic flow isolation barrier 968 of the continuous steady state differential pressure plenum region(s) is generated to provide a predetermined offset from the other predetermined section of the cassette support (such as support 36) or load port 24 isolated by the continuous steady state fluidic flow isolation barrier 968, and the predetermined offset is set by the fluid flow generating the differential pressure of the continuous steady state differential pressure plenum region(s). For example, referring also to FIG. 10B, the continuous steady state fluidic flow isolation barrier 968 includes continuous steady state differential plenum regions 962, 967 having respective boundaries 967B, 962B. The other predetermined section of the cassette support or shuttle 52 in this example, may be the aperture 10099 for the coupling features 60 that positively couple the container T to the shuttle. Motors, printed circuit boards, etc. that are to be protected from corrosive gases may be disposed beneath and accessible through the aperture 10099. The fluid mass flow of the respective continuous steady state differential plenum regions 962, 967 may be controlled so that the barriers 967B, 962B are offset by a distance 10098 from the aperture 10099 to substantially prevent corrosive gas egress into the aperture 10099. In one aspect, fluid edges (e.g., such as boundaries 960B, 961B, 962B, 963B, 964, 965, 966B, 967B) of the fluid flow of the continuous steady state fluidic flow isolation barrier 968 seal the other predetermined section from the predetermined access locations. In one aspect, the fluid edges of the fluid flow of the continuous steady state fluidic flow isolation barrier seal the other predetermined section from escapement of venting gas (e.g., the corrosive gas egress_910, 920, 930) from the sealed internal atmosphere of the at least one substrate cassette container T at the predetermined access locations.

Referring to FIGS. 9-11, in accordance with the aspects of the present disclosure, the load port module 24 includes one or more plenum ports 10010-10016 configured to generate or otherwise create the fluid flow that at least in part defines the boundaries 960B, 961B, 962B, 963B, 964, 965, 966B, 967B of the predetermined continuous steady state differential pressure plenum region(s). The one or more plenum ports 10010-10016 are separate and distinct from the container T vacuum purge ports 10000-10005 of the load port module 24. While the one or more plenum ports 10010-10016 are illustrated as substantially circular apertures or substantially rectangular apertures, in other aspects the one or more plenum ports may be elongated slits that circumscribe or are otherwise disposed adjacent predetermined features (such as those described herein) of the load port 24 so as to create fluidic walls that effect the boundaries 960B, 961B, 962B, 963B, 964, 965, 966B, 967B described herein. The one on or more plenum ports 10010-10016 are positioned proximate predetermined sections/regions of the load port module 24 exterior that is adjacent to a load port module 24 feature (e.g., such as those described above) having predetermined characteristics that make the feature susceptible to corrosion (e.g., from the corrosive gas egress) so as to substantially prevent the corrosive gas egress from interfacing or otherwise contacting the load port module 24 feature. In other aspects, referring also to FIGS. 12 and 13) one or more plenum ports 10017, 10018 (substantially similar to plenum ports 10010-10016) may be disposed between the shuttle 52 and the support 50 so that one or more continuous steady state differential pressure plenum region(s) 970, 971 (substantially similar to the other continuous steady state differential pressure plenum region(s) described herein) are disposed at least partially between the shuttle 52 and the support 50 so that boundaries 970B, 971B of the continuous steady state differential pressure plenum region(s) 970, 971 substantially prevent corrosive gas egress to any suitable components (e.g., motors, printed circuit boards, etc. as described herein). In still other aspects, the plenum ports may be disposed at any suitable positions of the load port to create any suitable number of continuous steady state differential pressure plenum region(s) to substantially protect load port components from corrosive gas egress with a corresponding continuous steady state fluidic flow isolation barrier. Depending on whether the one on or more plenum ports 10010-10018 are positive pressure ports or negative (e.g., vacuum) pressure ports, the one or more plenum ports 10010-10018 may be disposed above or below the load port feature around which the continuous steady state differential pressure plenum region(s) is to be provided.

The one or more plenum ports 10010-10018 are configured to create one or more of the boundaries 960B, 961B, 962B, 963B, 966B, 967B, 970B, 971B while other boundaries 964, 965 may be created by the structure of the load port 24 (such as a surface 52S (FIG. 10A) of the shuttle 52) and/or the substrate cassette container T, where the continuous steady state differential pressure plenum region(s) is bounded at least on one side by a surface of the cassette support structure of the load port 24 defining the continuous steady state differential pressure plenum region(s) at least on part. In one aspect, the surface 52S may guide the fluid flow generating the differential pressure of the continuous steady state differential pressure plenum region(s). In one aspect, the surface 52S may include vanes 52V (FIG. 10A) or other fluid flow control features that guide the fluid flow generating the differential pressure of the continuous steady state differential pressure plenum region(s). In one aspect, each plenum port 10010-10018 is configured to generate a respective predetermined continuous steady state differential pressure plenum region that circumscribes or otherwise surrounds the respective plenum port 10010-10018 and an at least a portion of an associated predetermined access location (e.g., respective vacuum/purge ports 10000-10005 and container/door interface 983).

As can be seen in FIGS. 9 and 10A (noting the container T is not illustrated in FIG. 10A for clarity), the plenum ports 10010, 10013 are configured to generate respective predetermined differential pressure plenums 966, 961 having respective boundaries 966B, 961B. The plenum ports 10002, 10012 are configured to generate respective predetermined differential pressure plenums 967, 962 having respective boundaries 967B, 962B. As may be realized, the bottom surface of the container T and the exterior surface of the shuttle 52 may also form boundaries 964, 965 of the respective differential pressure plenums 966, 961, 967, 962. The differential pressure plenums may substantially contain corrosive gas egress from an associated vacuum/purge port 776 of the container T substantially coupled to a respective vacuum/purge port 10000-10005 of the load port module 24).

As can be seen in FIGS. 9, 10B, and 11, one or more of the plenum ports 10014-10018 is/are configured to generate respective differential pressure plenum 963 having respective boundary 963B. As may be realized at least a portion of the boundary 963B may be formed by the exterior surface of the shuttle 52 and or the container T. The differential pressure plenum may be sized to substantially contain corrosive gas egress from one or more of the container/door interface 983 and a load port door 30D to load port frame 29 interface 276 (see FIG. 2). The differential pressure plenum port 10014 may be disposed on the load port module 24 shelf 50 while the differential pressure plenum ports 10015, 10016 may be disposed on a side of the shuttle 52 facing the load port opening 30P so that the differential pressure plenum 963 extends from the load port door 30D to load port frame 29 interface 276 to the container/door interface 983; while in other aspects, the differential pressure plenum ports 10015, 10016 on the shuttle 52 and the differential pressure plenum port 10014 on the shelf 50 may provide for separate and distinct differential pressure plenums (e.g., when the shuttle 52 is disposed at a container T load position) where the separate and distinct differential pressure plenums merge when the shuttle is disposed at a container T docking position (e.g., where the container substrate passage opening, through which substrates enter and exit the container, is mated with the load port opening 30P). In this aspect, at least some of the differential pressure plenum ports may be stationary with respect to the shuttle 52 reference frame (e.g., the differential pressure plenum ports are mounted to the shuttle) while other differential pressure plenum ports are stationary or fixed relative to the load port module 24 frame 29 (e.g., where the shuttle and/or a part to be protected from corrosive gases moves relative to the frame 29).

In one aspect, a size of the respective differential pressure plenums 966, 961, 967, 962, 963, 970, 971 may be increased or decreased by adjusting a mass flow rate of fluid moving into (e.g., a vacuum/suction pressure plenum) or out of (e.g., a positive pressure plenum) the respective plenum ports 10010-10018. Referring to FIG. 9, a size of the respective differential pressure plenums 966, 961, 967, 962, 963 may be such that one or more of the respective differential pressure plenums merge with another of the differential pressure plenums. For example, as illustrated in FIG. 9, the differential pressure plenums 961, 966, 962, 967 may merge to form combined differential pressure plenum 960 that extends over substantially an entirety of the container T bottom. In still other aspects, differential pressure plenum 963 may also be merged with differential pressure plenum 960 so that the differential pressure plenum also extends to cover the container door 30D/container T interface 983 (and/or the load port door/frame interface 276—FIG. 2). In other aspects the sizes of the differential pressure plenums 966, 961, 967, 962, 963 may be sized so that any suitable number of the differential pressure plenums are merged into a common differential pressure plenum.

Figure 13:
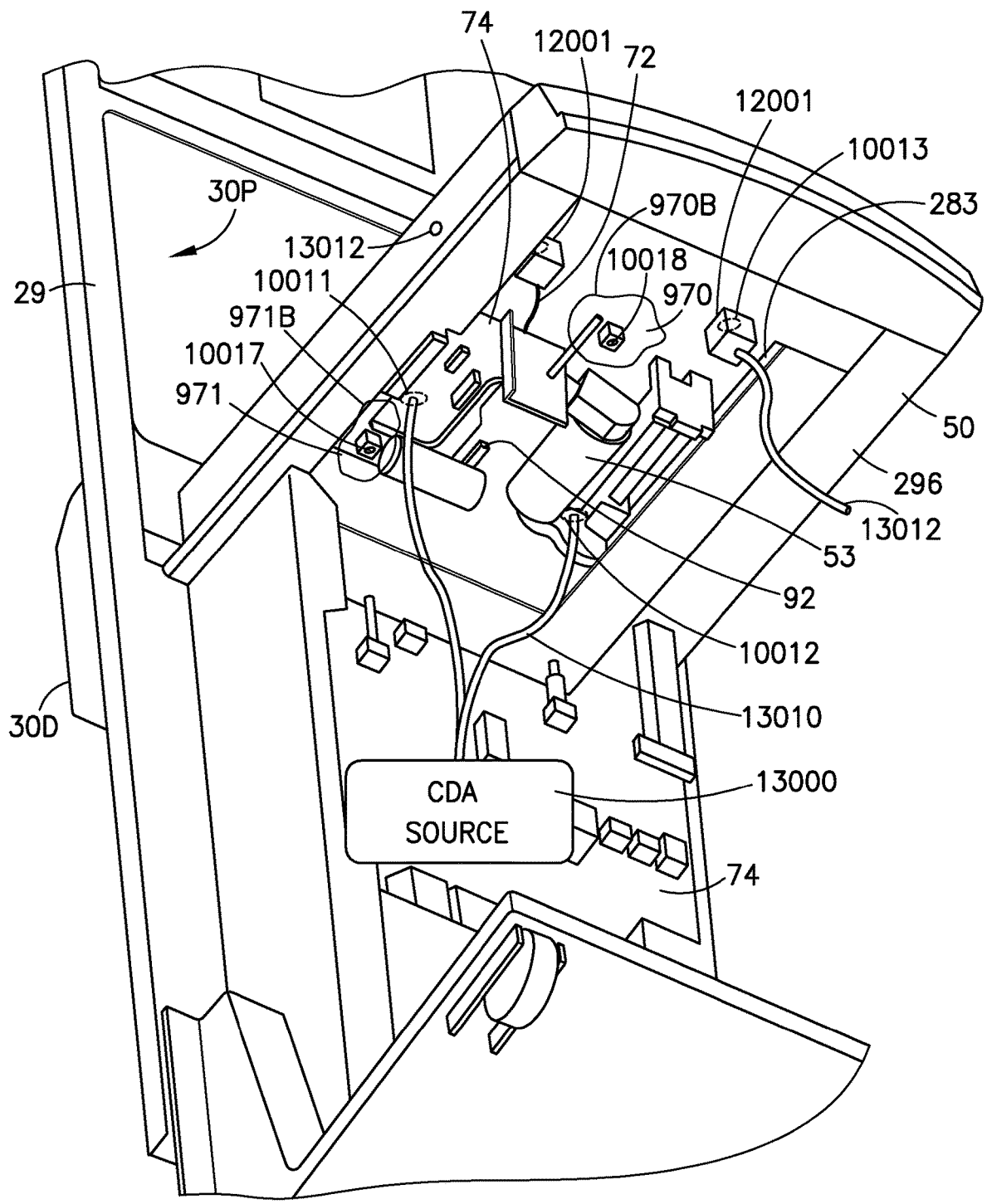
FIG. 13 is a schematic illustration of a portion of the load port module of FIG. 2 in accordance with aspects of the present disclosure.

Still referring to FIGS. 9-11, as described above, the continuous steady state fluidic flow isolation barrier 968 formed by the predetermined continuous steady state differential pressure plenum region(s) 960, 961, 962, 963, 966, 967 may be a positive pressure continuous steady state fluidic flow isolation barrier. For example, the differential pressure ΔP (see in FIG. 9) is a positive pressure relative to atmosphere (e.g., an external area surrounding the container T and load port module 24). In another aspect, the differential pressure ΔP is a positive pressure relative to a pressure (e.g., partial pressure) of escapement gas (e.g., the corrosive gas egress 910, 920, 930) from the sealed internal atmosphere of the at least one substrate cassette container T at the predetermined access locations (e.g., ports 776). Referring also to FIG. 13, where the continuous steady state fluidic flow isolation barrier 968 formed by the predetermined continuous steady state differential pressure plenum region(s) 960, 961, 962, 963, 966, 967 is the positive pressure continuous steady state fluidic flow isolation barrier, clean dry air from any suitable clean dry air source 13000 is provided to one or more of the differential pressure plenum ports 10010-10018 in any suitable manner (e.g., such as through suitable conduits 13010). Any suitable pressure sensors may be provided on the load port module 24 to monitor the clean dry air emitted from the one or more of the differential pressure plenum ports 10010-10018. The clean dry air may be provided substantially continuously (e.g., at container docking with the shuttle 52, at coupling of the container T to the load port opening 30P, at decoupling of the container from the load port opening 30P, and at undocking of the container T from the shuttle 52) so that the positive pressure continuous steady state fluidic flow isolation barrier substantially prevents corrosive gases from at least the container T from entering the areas of the load port module 24 around which the continuous steady state fluidic flow isolation barrier(s) 968 is provided.

Still referring to FIGS. 9-11, as described above, the continuous steady state fluidic flow isolation barrier 968 formed by the predetermined continuous steady state differential pressure plenum region(s) 960, 961, 962, 963, 966, 967 may be a negative pressure continuous steady state fluidic flow isolation barrier. For example, the differential pressure ΔP (see in FIG. 9) is a negative pressure relative to atmosphere (e.g., the external area surrounding the container T and load port module 24). In another aspect, the differential pressure ΔP is a negative pressure relative to pressure (e.g., a partial pressure) of an escapement gas (e.g., the corrosive gas egress 910, 920, 930) from the sealed internal atmosphere of the at least one substrate cassette container T at the predetermined access locations (e.g., ports 776). The negative pressure continuous steady state fluidic flow isolation barrier may be employed in conjunction with or in lieu of the positive pressure continuous steady state fluidic flow isolation barrier. Similarly, the positive pressure continuous steady state fluidic flow isolation barrier may be employed without the negative pressure continuous steady state fluidic flow isolation barrier.

Figure 12:
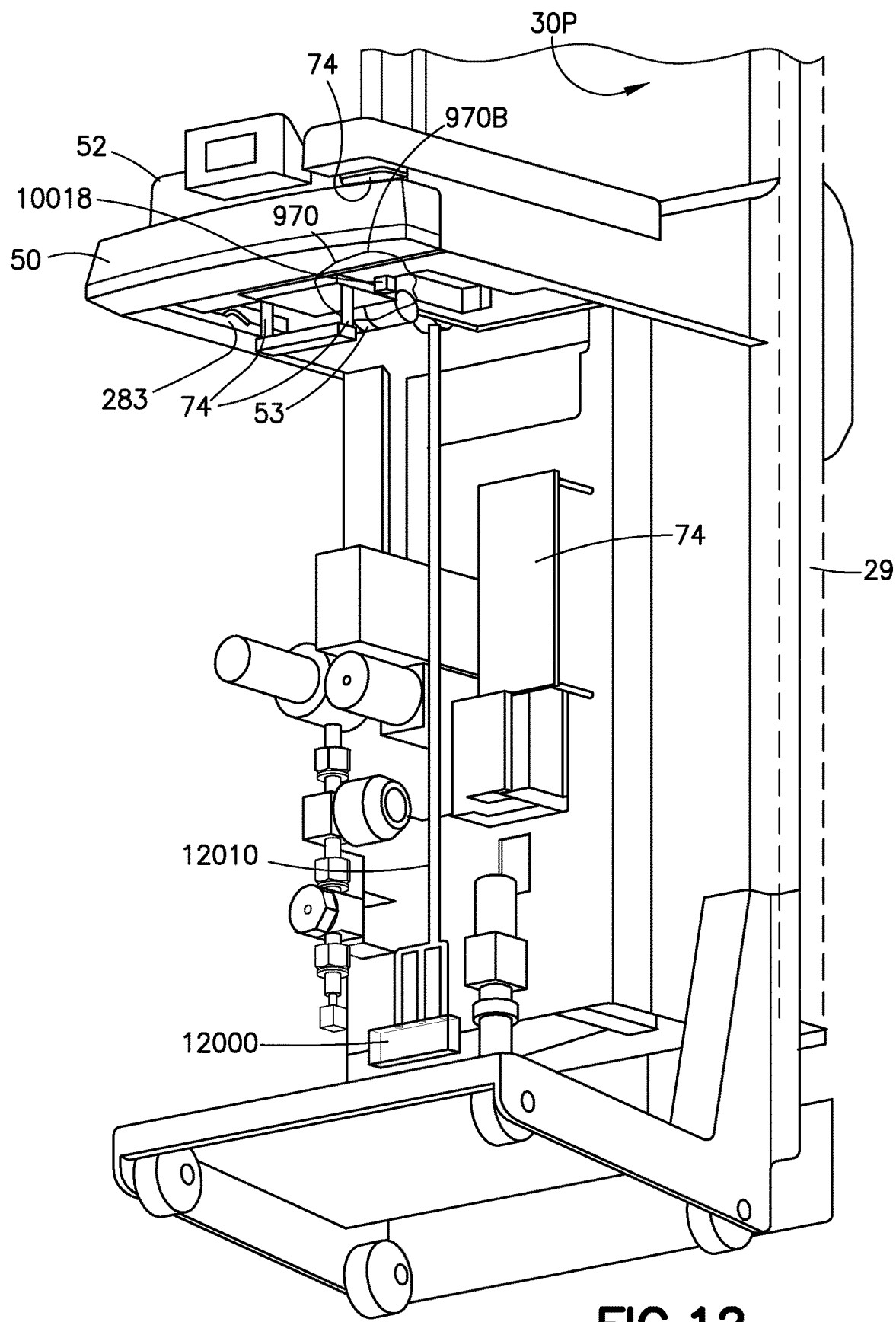
FIG. 12 is a schematic illustration of a portion of the load port module of FIG. 2 in accordance with aspects of the present disclosure.

In one aspect, referring also to FIG. 12, where the continuous steady state fluidic flow isolation barrier 968 formed by the predetermined continuous steady state differential pressure plenum region(s) 960, 961, 962, 963, 966, 967 is the negative pressure continuous steady state fluidic flow isolation barrier, vacuum/suction from any suitable remote (e.g., located away from the load port shuttle 52 and shuttle support 50) vacuum/suction source 12000 (e.g., such as a pump, fan, vacuum, etc.) is provided to one or more of the differential pressure plenum ports 10010-10016 in any suitable manner (e.g., such as through suitable conduits 12010). In another aspect, referring also to FIG. 13, where the continuous steady state fluidic flow isolation barrier 968 formed by the predetermined continuous steady state differential pressure plenum region(s) 960, 961, 962, 963, 966, 967 is the negative pressure continuous steady state fluidic flow isolation barrier, vacuum/suction from any suitable local (e.g., disposed on the shuttle 52 and/or shuttle support 50) vacuum/suction source 12001 (e.g., such as a pump (e.g., acoustic air pump, piezo pump, diaphragm pump, etc.), fan, etc.) is provided to one or more of the differential pressure plenum ports 10010-10018 in any suitable manner (e.g., such as through suitable conduits 12010). While the local vacuum/suction source 12001 is illustrated as being coupled to the shuttle 52 so as to move with the shuttle 52; it should be understood that the vacuum/suction source 12001 may be coupled to the shuttle support 50 in a similar manner (such as to, e.g., provide suction to the differential pressure plenum port 10014) so as to be stationary with the shuttle support 50. The suctioned corrosive gases evacuated by the negative pressure predetermined continuous steady state differential pressure plenum region(s) 960, 961, 962, 963, 966, 967 may be discharged away from the load port module 24 at any suitable location. Where the vacuum/suction source 12001 is local to the shuttle 52 and/or shuttle support 50 any suitable fluid directing paths 13012 (e.g., channels, hoses, vanes, passages, etc.) may be formed in or pass through the shuttle 52 and/or shuttle support to output/exhaust any corrosive gas egress 910, 920, 930 that may escape from the sealed environment of the container T.

Referring to FIGS. 7A, 8A, 9, and 10A, an exemplary docking process between the container T and the load port 24 will be described. For example, the container T is transported to the load port 24 (FIG. 8A, Block 800) and is optionally clamped to the load port (FIG. 8A, Block 805), such as with the container clamping system 61 described above. At arrival of the container T the predetermined continuous steady state differential pressure plenum region(s) 960, 961, 962, 963, 966, 967 are active so that the continuous steady state fluidic flow isolation barrier 968 is formed upon coupling the container T to the shuttle 52. In this aspect, the vacuum purge ports 10000-10005 of the load port 24 may be automatically coupled with the ports 776 of the container T. As described above, coupling of the container T to the gas source 1010G and/or vacuum source 1010V (and/or actuation of the same when coupled to the container T) may cause corrosive gas egress 910, 920, 930 (see FIG. 9) from the container T, such as at the couplings between the ports 10000-10005 with the ports 776, and/or through a door seal 940 of the container T. The corrosive gas egress 910, 920, 930 may be substantially contained/confined and/or evacuated with the differential pressure plenum space or region on (or active). For example, as described above, the continuous steady state fluidic flow isolation barrier 968 may substantially contain (e.g., in the case of a vacuum barrier) or substantially prevent ingress (in the case of a positive pressure barrier) of any corrosive gas egress 910, 920, 930 from the sealed environment of the container T that occurs, upon coupling of the ports 10000-10005 with the ports 776, to the areas of the load port (such as those noted above) protected from the corrosive gas by the fluidic isolation barrier 968.

Figure 8A:
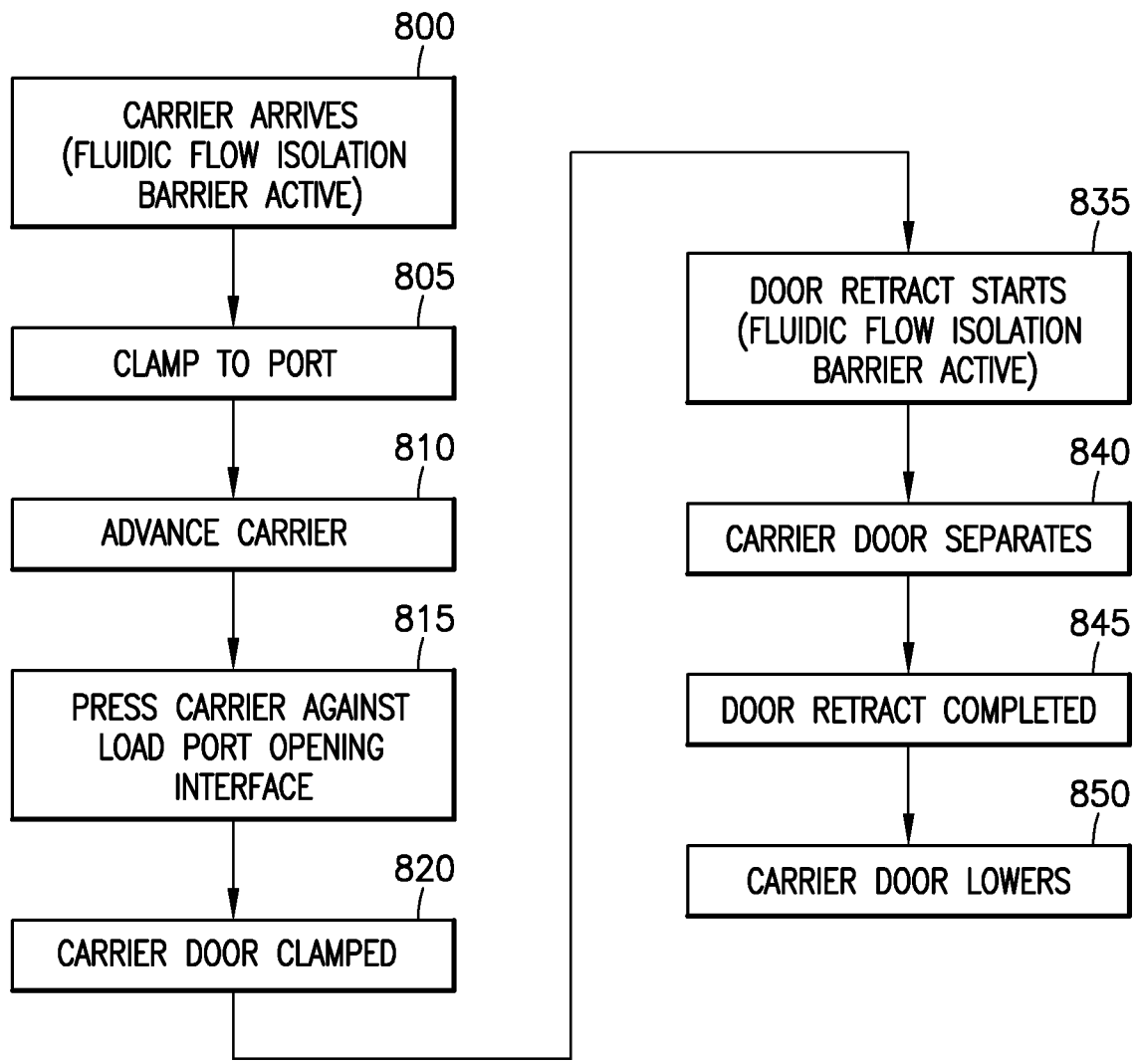
FIG. 8A is a flow diagram for coupling a container to a substrate processing apparatus in accordance with aspects of the present disclosure.

The load port 24 shuttle 52 advances the container T to the container/load port interface 750, where the container/load port interface 750 is a BOLTS interface (FIG. 8A, Block 810). Prior to or during advancement of the container T to the container/load port interface 750 the container T may be vented and/or purged as described above. In one aspect, the load port door may also include a vacuum that may be activated during advancement of the container T so that any particulate matter on the surface of the container T may be removed during the interfacing of the container T and load port 24.

The load port 24 shuttle 52 presses the container T against the container/load port interface 276 (FIG. 2) to couple the container T to the load port 24 (FIG. 8A, Block 815). The container door T4 (FIG. 6A) is clamped to the load port door 30D, as described herein, (FIG. 8A, Block 820). The predetermined continuous steady state differential pressure plenum region(s) 960, 961, 962, 963, 966, 967 may remain active so that the continuous steady state fluidic flow isolation barrier 968 exists in an area at least partially occupied or otherwise located beneath by the container door T4 to port door 30D interface. The container door T4 starts to retract (FIG. 8A, Block 835). As the container door T4 starts to retract the seal between the container T and the container door T4 may be relaxed and corrosive gas from inside the container T may escape from the container. The predetermined continuous steady state differential pressure plenum region(s) 960, 961, 962, 963, 966, 967 (such as differential plenum region 963) may substantially contain (e.g., in the case of a vacuum barrier) or substantially prevent ingress (in the case of a positive pressure barrier) of any corrosive gas egress 910, 920, 930 from the sealed environment of the container T that occurs upon retraction of the container door T4 from the container T. The container door T4 separates from the container T (FIG. 8A, Block 845) and is lowered into the door storage area 770 (FIG. 7A) of the load port 24

(FIG. 8A, Block 850). In alternate aspects, the container T may be registered/docked to the load port 24 in any suitable manner.

Figure 8B:
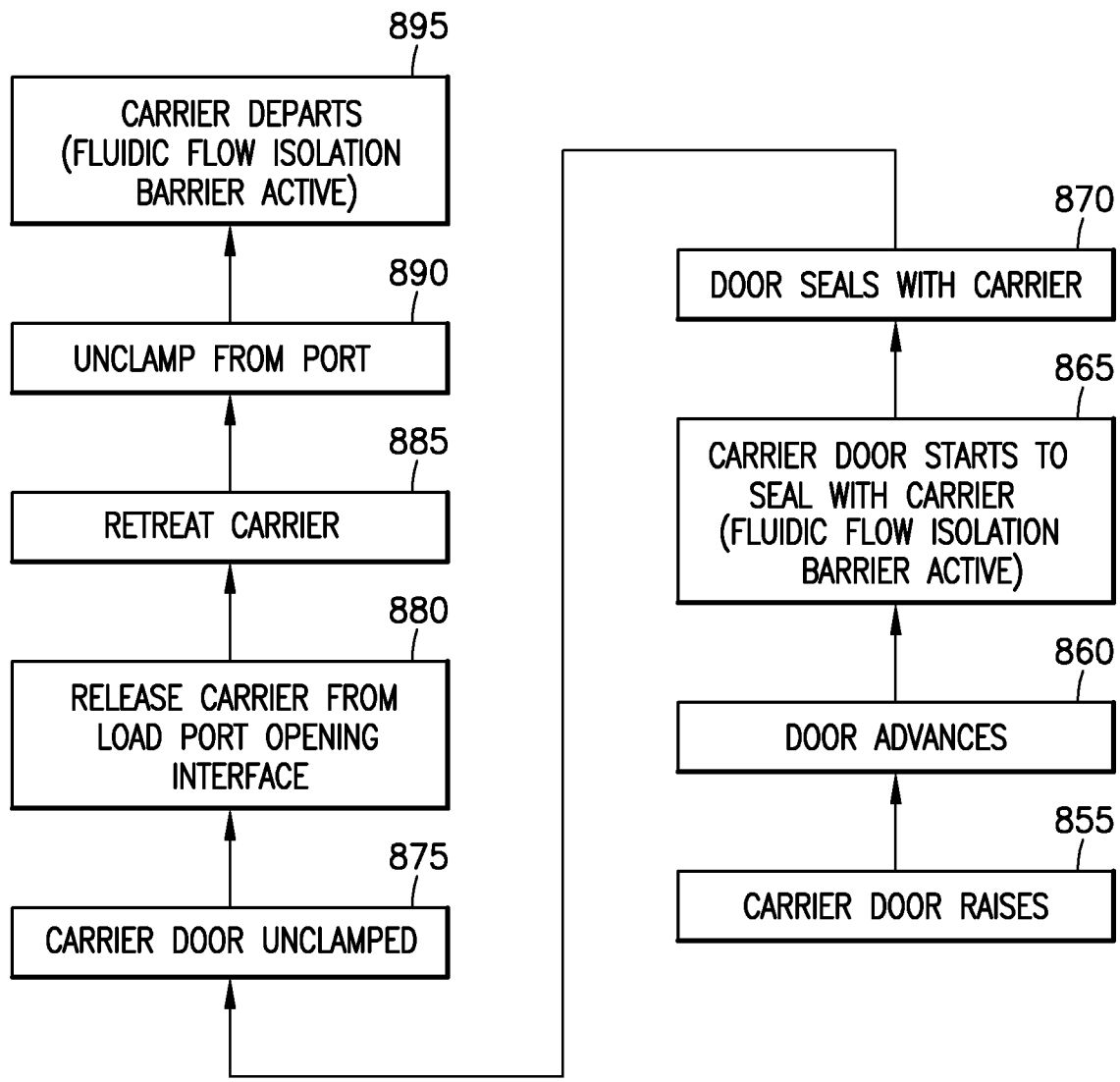
FIG. 8B is a flow diagram for decoupling a container to a substrate processing apparatus in accordance with aspects of the present disclosure.

Referring to FIGS. 7A, 8B, 9, and 10A, an exemplary undocking process between the container T and the load port 24 will be described. The container door T4 is raised from the door storage area 770 (FIG. 8B, Block 855) and is advanced towards the container T (FIG. 8A, Block 860). The container door T4 starts to seal with the container (FIG. 8B, Block 865) and further advancement of the container door T4 seals the container door T4 with the container T (FIG. 8B, Block 870). As the container door starts to seal and seals with the container T gases from the interior of the container T may be displaced out of the container either through the door seal 940 (FIG. 9) and/or through the interface between the ports 776 of the container T and the ports 10000-10005 of the load port 24. The predetermined continuous steady state differential pressure plenum region(s) 960, 961, 962, 963, 966, 967 may substantially contain (e.g., in the case of a vacuum barrier) or substantially prevent ingress (in the case of a positive pressure barrier) of any corrosive gas egress 910, 920, 930 from the container T that occurs upon sealing of the container door T4 with the container T.

The container door T4 is unclamped, from e.g., the load port door 30D, (FIG. 8B, Block 875) and the container T is released from the container to load port opening interface 276 (FIG. 2). The container T retreats from the interface 276 through movement of the shuttle 52 (FIG. 8A, Block 885). In some aspects the container T is unclamped from the shuttle 85 of the load port 24 (FIG. 8B, Block 890). The container T departs from the load port 24 (FIG. 8B, Block 985) in any suitable manner, such as through automated handling devices or manually. Decoupling of the container T from the gas source 1010G and/or vacuum source 1010V may cause corrosive gas egress 910, 920, 930 (see FIG. 9) from the container T, such as at the couplings between the ports 10000-10005. The corrosive gas egress 910, 920, 930 may be substantially contained/confined and/or evacuated with the differential pressure plenum space or region on (or active). For example, as described above, the continuous steady state fluidic flow isolation barrier 968 may substantially contain (e.g., in the case of a vacuum barrier) or substantially prevent ingress (in the case of a positive pressure barrier) of any corrosive gas egress 910, 920, 930 from the sealed environment of the container T that occurs, upon decoupling of the ports 10000-10005 from the ports 776, to the areas of the load port (such as those noted above) protected from the corrosive gas by the fluidic isolation barrier 968. In alternate aspects, the container T may be unregistered/undocked from the load port 24 in any suitable manner.

Figure 14:
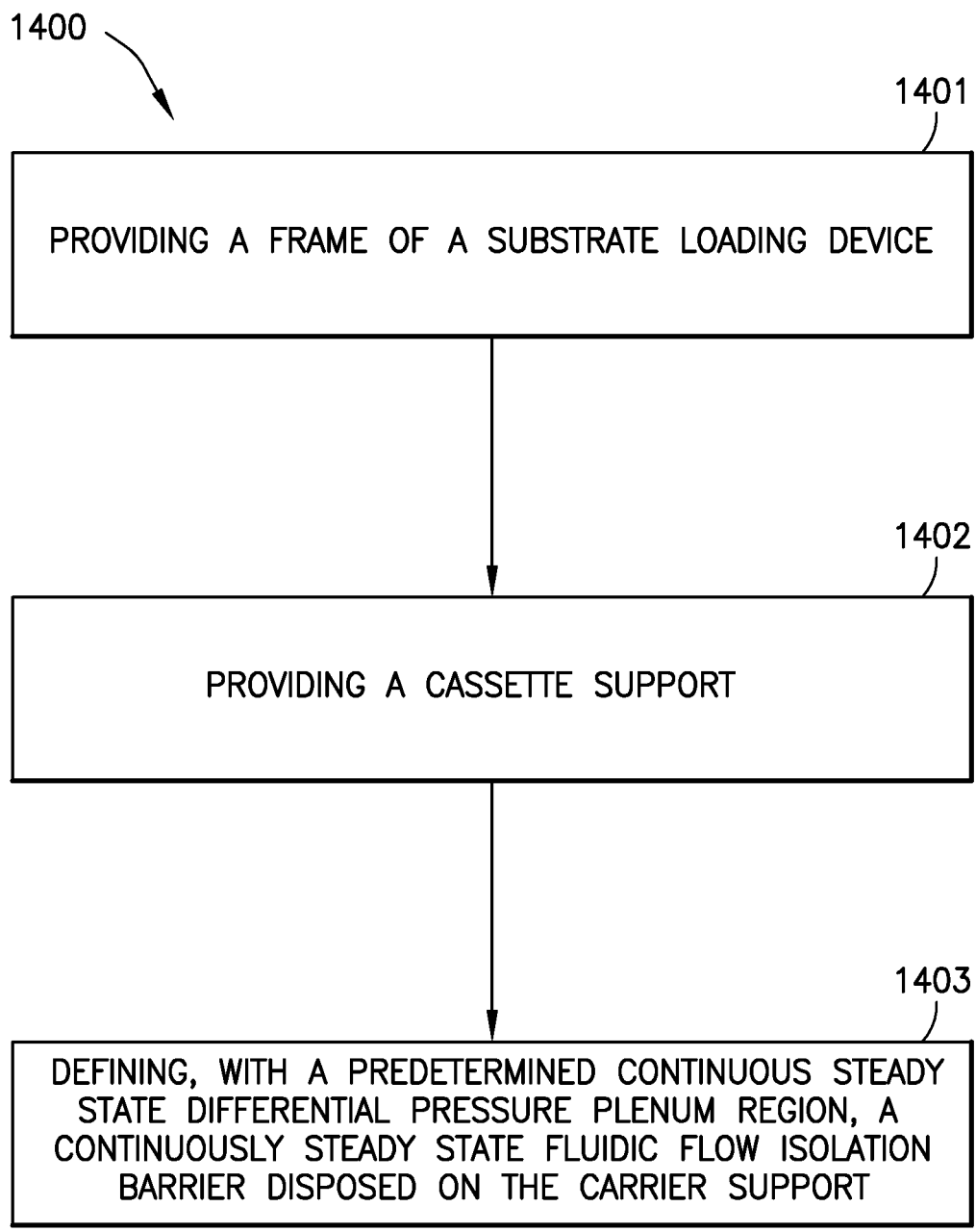
FIG. 14 is an exemplary flow diagram in accordance with aspects of the present disclosure.
Figure 15:
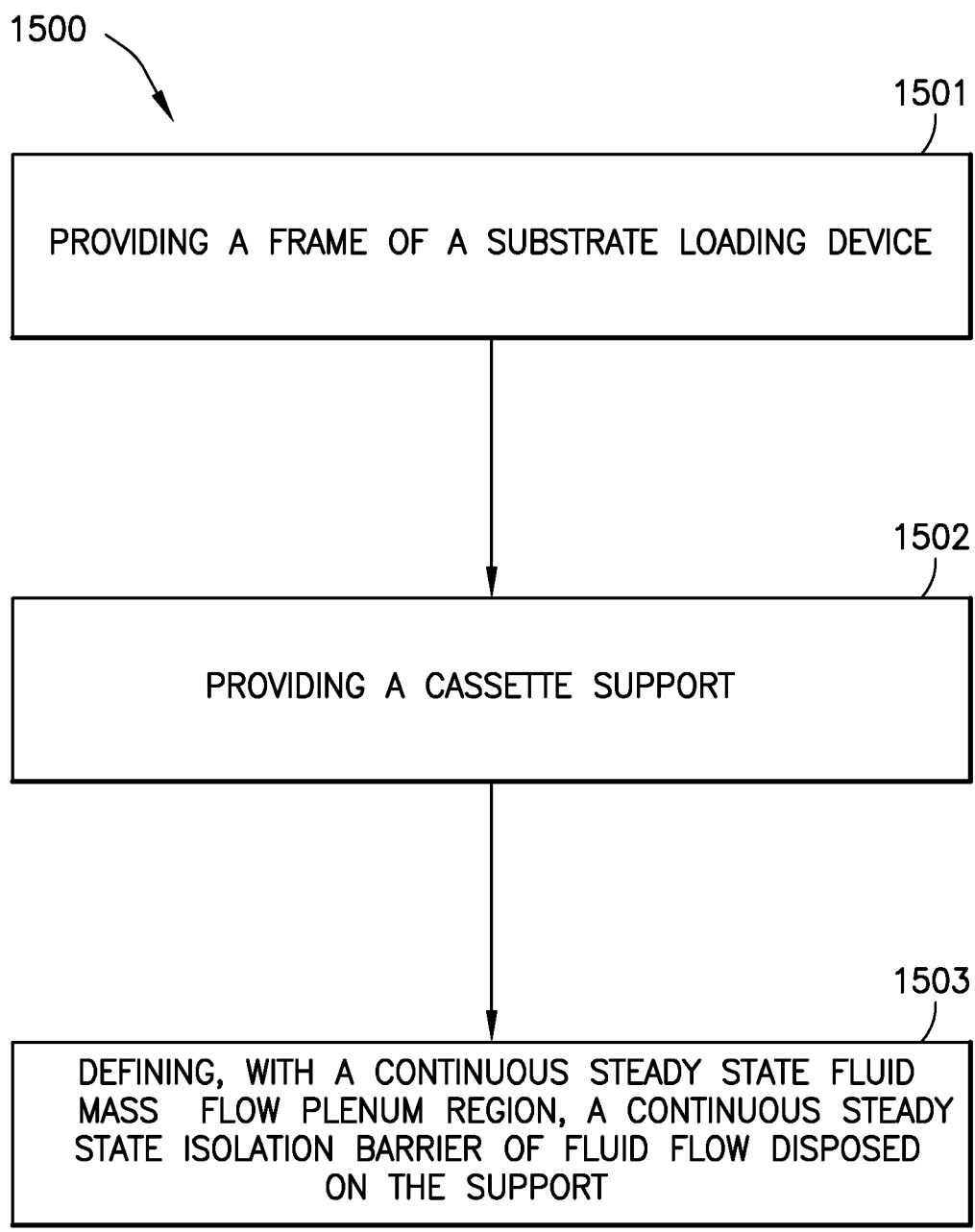
FIG. 15 is an exemplary flow diagram in accordance with aspects of the present disclosure.

Referring to FIGS. 7A, 8B, 9, 10A, and 14 an exemplary method 1400 will be described. The method 1400 includes providing a frame 29 of a substrate loading device (FIG. 14, Block 1401). The frame 29 being adapted to connect the substrate loading device to a substrate processing apparatus 10, the frame 29 having a transport opening 30P through which substrates are transported between the substrate loading device and processing apparatus 10. A cassette support 28 is provided (FIG. 14, Block 1402) and is connected to the frame 29 for holding at least one substrate cassette container T proximate the transport opening 30P, the cassette support 28 being configured so that a sealed internal atmosphere 977 of the at least one substrate cassette container T is accessed from the cassette support 28 at predetermined access locations 776 of the at least one substrate cassette container T. The method also includes defining, with a predetermined continuous steady state differential pressure plenum region 960-963, a continuously steady state fluidic flow isolation barrier 968 disposed on the cassette support 28 (FIG. 14, Block 1403) between the predetermined access locations 776 of the at least one substrate cassette container T and another predetermined section of the cassette support 28 isolating the other predetermined section from the predetermined access locations 776, where the cassette support 28 has the predetermined continuous steady state differential pressure plenum region 960-963 disposed on the cassette support 28 and the predetermined continuous steady state differential pressure plenum region 960-963 is determined at least in part by boundaries 960B, 961B, 962B, 963B, 964, 965, 966B, 967B of fluid flow generating differential pressure.

Referring to FIGS. 7A, 8B, 9, 10A, and 15 an exemplary method 1500 will be described. The method 1500 includes providing a frame 29 of a substrate loading device (FIG. 15, Block 1501) adapted to connect the device to a substrate processing apparatus 10, the frame 29 having a transport opening 30P through which substrates are transported between the device and processing apparatus. A cassette support 28 is provided (FIG. 15, Block 1502) and is connected to the frame 29 for holding at least one substrate cassette container T proximate the transport opening 30P, the support 28 being configured so that a sealed internal atmosphere 977 of the container T is accessed from the support 28 at predetermined access locations 776 of the container T. The method also includes defining, with a continuous steady state fluid mass flow plenum region, a continuous steady state isolation barrier 968 of fluid flow disposed on the support 28 (FIG. 15, Block 1503) between the predetermined access locations 776 of the container T and another predetermined section of the cassette support 28 isolating the other predetermined section from the predetermined access locations 776, where the cassette support 28 has the predetermined continuous steady state fluid mass flow plenum region disposed on the support 28 and the predetermined continuous steady state fluid mass flow plenum region is determined at least in part by boundaries 960B, 961B, 962B, 963B, 964, 965, 966B, 967B of fluid mass flow.

In accordance with one or more aspects of the present disclosure a substrate loading device is provided. The substrate loading device comprises: a frame adapted to connect the substrate loading device to a substrate processing apparatus, the frame having a transport opening through which substrates are transported between the substrate loading device and processing apparatus; a cassette support connected to the frame for holding at least one substrate cassette container proximate the transport opening, the cassette support being configured so that a sealed internal atmosphere of the at least one substrate cassette container is accessed from the cassette support at predetermined access locations of the at least one substrate cassette container; and the cassette support has a predetermined continuous steady state differential pressure plenum region disposed on the cassette support, determined at least in part by boundaries of fluid flow generating differential pressure, so that the predetermined continuous steady state differential pressure plenum region defines a continuous steady state fluidic flow isolation barrier disposed on the container support between the predetermined access locations of the at least one substrate cassette container and another predetermined section of the cassette support isolating the other predetermined section from the predetermined access locations.

In accordance with one or more aspects of the present disclosure fluid edges of the fluid flow of the continuous steady state fluidic flow isolation barrier seal the other predetermined section from the predetermined access locations.

In accordance with one or more aspects of the present disclosure fluid edges of the fluid flow of the continuous steady state fluidic flow isolation barrier seal the other predetermined section from escapement of venting gas from the sealed internal atmosphere of the at least one substrate cassette container at the predetermined access locations.

In accordance with one or more aspects of the present disclosure the differential pressure is a positive pressure relative to atmosphere.

In accordance with one or more aspects of the present disclosure the differential pressure is a positive pressure relative to a pressure of escapement gas from the sealed internal atmosphere of the at least one substrate cassette container at the predetermined access locations.

In accordance with one or more aspects of the present disclosure the differential pressure is a negative pressure relative to atmosphere.

In accordance with one or more aspects of the present disclosure the differential pressure is a negative pressure relative to pressure of an escapement gas from the sealed internal atmosphere of the at least one substrate cassette container at the predetermined access locations.

In accordance with one or more aspects of the present disclosure the predetermined continuous steady state differential pressure plenum region is bounded at least on one side by a surface of the cassette support defining the predetermined continuous steady state differential pressure plenum region at least in part.

In accordance with one or more aspects of the present disclosure the surface is a guide surface for the fluid flow generating the differential pressure of the predetermined continuous steady state differential pressure plenum region.

In accordance with one or more aspects of the present disclosure the continuously steady state fluidic flow isolation barrier of the continuous steady state differential pressure plenum region is generated to provide a predetermined offset from the other predetermined section of the cassette support isolated by the continuously steady state fluidic flow isolation barrier, and the predetermined offset is set by the fluid flow generating the differential pressure of the continuous steady state differential pressure plenum region.

In accordance with one or more aspects of the present disclosure, the substrate loading device includes a controller that controls the predetermined continuous steady state differential pressure plenum region depending on a configuration of the at least one substrate cassette container.

In accordance with one or more aspects of the present disclosure a substrate loading device includes a frame adapted to connect the device to a substrate processing apparatus, the frame having a transport opening through which substrates are transported between the device and processing apparatus; a cassette support connected to the frame for holding at least one substrate cassette container proximate the transport opening, the support being configured so that a sealed internal atmosphere of the container is accessed from the support at predetermined access locations of the container; and the cassette support has a predetermined continuous steady state fluid mass flow plenum region disposed on the support, determined at least in part by boundaries of fluid mass flow, so that the continuous steady state fluid mass flow plenum region defines a continuous steady state isolation barrier of fluid flow disposed on the support between the predetermined access locations of the container and another predetermined section of the cassette support isolating the other predetermined section from the predetermined access locations.

In accordance with one or more aspects of the present disclosure fluid edges of the fluid flow of the continuous steady state isolation barrier of fluid flow seal the other predetermined section from the predetermined access locations.

In accordance with one or more aspects of the present disclosure fluid edges of the fluid flow of the continuous steady state isolation barrier of fluid flow seal the other predetermined section from escapement of venting gas from the sealed internal atmosphere of the at least one substrate cassette container at the predetermined access locations.

In accordance with one or more aspects of the present disclosure the differential pressure is a positive pressure relative to atmosphere.

In accordance with one or more aspects of the present disclosure the fluid mass flow has a positive pressure relative to a pressure of escapement gas from the sealed internal atmosphere of the at least one substrate cassette container at the predetermined access locations.

In accordance with one or more aspects of the present disclosure the fluid mass flow has a negative pressure relative to atmosphere.

In accordance with one or more aspects of the present disclosure the fluid mass flow has a negative pressure relative to pressure of an escapement gas from the sealed internal atmosphere of the at least one substrate cassette container at the predetermined access locations.

In accordance with one or more aspects of the present disclosure the predetermined continuous steady state fluid mass flow plenum region is bounded at least on one side by a surface of the cassette support defining the predetermined continuous steady state fluid mass flow plenum region at least in part.

In accordance with one or more aspects of the present disclosure the surface is a guide surface for the fluid mass flow of the predetermined continuous steady state fluid mass flow plenum region.

In accordance with one or more aspects of the present disclosure the continuously steady state isolation barrier of fluid flow of the continuous steady state fluid mass flow plenum region is generated to provide a predetermined offset from the other predetermined section of the cassette support isolated by the continuously steady state isolation barrier of fluid flow, and the predetermined offset is set by the fluid mass flow of the continuous steady state fluid mass flow plenum region.

In accordance with one or more aspects of the present disclosure, the substrate loading device includes a controller that controls the predetermined continuous steady state differential pressure plenum region depending on a configuration of the at least one substrate cassette container.

In accordance with one or more aspects of the present disclosure a method is provided. The method including providing a frame of a substrate loading device, the frame being adapted to connect the substrate loading device to a substrate processing apparatus, the frame having a transport opening through which substrates are transported between the substrate loading device and processing apparatus, providing a cassette support connected to the frame for holding at least one substrate cassette container proximate the transport opening, the cassette support being configured so that a sealed internal atmosphere of the at least one substrate cassette container is accessed from the cassette support at predetermined access locations of the at least one substrate cassette container, and defining, with a predetermined continuous steady state differential pressure plenum region, a continuously steady state fluidic flow isolation barrier disposed on the carrier support between the predetermined access locations of the at least one substrate cassette container and another predetermined section of the cassette support isolating the other predetermined section from the predetermined access locations, where the cassette support has the predetermined continuous steady state differential pressure plenum region disposed on the cassette support and the predetermined continuous steady state differential pressure plenum region is determined at least in part by boundaries of fluid flow generating differential pressure.

In accordance with one or more aspects of the present disclosure further including sealing, with fluid edges of the fluid flow of the continuous steady state fluidic flow isolation barrier, the other predetermined section from the predetermined access locations.

In accordance with one or more aspects of the present disclosure further including sealing, with fluid edges of the fluid flow of the continuous steady state fluidic flow isolation barrier, the other predetermined section from escapement of venting gas from the sealed internal atmosphere of the at least one substrate cassette container at the predetermined access locations.

In accordance with one or more aspects of the present disclosure the differential pressure is a positive pressure relative to atmosphere.

In accordance with one or more aspects of the present disclosure the differential pressure is a positive pressure relative to a pressure of escapement gas from the sealed internal atmosphere of the at least one substrate cassette container at the predetermined access locations.

In accordance with one or more aspects of the present disclosure the differential pressure is a negative pressure relative to atmosphere.

In accordance with one or more aspects of the present disclosure the differential pressure is a negative pressure relative to pressure of an escapement gas from the sealed internal atmosphere of the at least one substrate cassette container at the predetermined access locations.

In accordance with one or more aspects of the present disclosure the predetermined continuous steady state differential pressure plenum region is bounded at least on one side by a surface of the cassette support defining the predetermined continuous steady state differential pressure plenum region at least in part.

In accordance with one or more aspects of the present disclosure the surface is a guide surface for the fluid flow generating the differential pressure of the predetermined continuous steady state differential pressure plenum region.

In accordance with one or more aspects of the present disclosure the continuously steady state fluidic flow isolation barrier of the continuous steady state differential pressure plenum region is generated to provide a predetermined offset from the other predetermined section of the cassette support isolated by the continuously steady state fluidic flow isolation barrier, and the predetermined offset is set by the fluid flow generating the differential pressure of the continuous steady state differential pressure plenum region.

In accordance with one or more aspects of the present disclosure further including controlling, with a controller, the predetermined continuous steady state differential pressure plenum region depending on a configuration of the at least one substrate cassette container.

In accordance with one or more aspects of the present disclosure a method is provided. The method including providing a frame of a substrate loading device adapted to connect the device to a substrate processing apparatus, the frame having a transport opening through which substrates are transported between the device and processing apparatus, providing a cassette support connected to the frame for holding at least one substrate cassette container proximate the transport opening, the support being configured so that a sealed internal atmosphere of the container is accessed from the support at predetermined access locations of the container, and defining, with a continuous steady state fluid mass flow plenum region, a continuous steady state isolation barrier of fluid flow disposed on the support between the predetermined access locations of the container and another predetermined section of the cassette support isolating the other predetermined section from the predetermined access locations, where the cassette support has the predetermined continuous steady state fluid mass flow plenum region disposed on the support and the predetermined continuous steady state fluid mass flow plenum region is determined at least in part by boundaries of fluid mass flow.

In accordance with one or more aspects of the present disclosure further including sealing, with fluid edges of the fluid flow of the continuous steady state isolation barrier of fluid flow, the other predetermined section from the predetermined access locations.

In accordance with one or more aspects of the present disclosure further including sealing, with fluid edges of the fluid flow of the continuous steady state isolation barrier of fluid flow, the other predetermined section from escapement of venting gas from the sealed internal atmosphere of the at least one substrate cassette container at the predetermined access locations.

In accordance with one or more aspects of the present disclosure the differential pressure is a positive pressure relative to atmosphere.

In accordance with one or more aspects of the present disclosure the fluid mass flow has a positive pressure relative to a pressure of escapement gas from the sealed internal atmosphere of the at least one substrate cassette container at the predetermined access locations.

In accordance with one or more aspects of the present disclosure the fluid mass flow has a negative pressure relative to atmosphere.

In accordance with one or more aspects of the present disclosure the fluid mass flow has a negative pressure relative to pressure of an escapement gas from the sealed internal atmosphere of the at least one substrate cassette container at the predetermined access locations.

In accordance with one or more aspects of the present disclosure the predetermined continuous steady state fluid mass flow plenum region is bounded at least on one side by a surface of the cassette support defining the predetermined continuous steady state fluid mass flow plenum region at least in part.

In accordance with one or more aspects of the present disclosure the surface is a guide surface for the fluid mass flow of the predetermined continuous steady state fluid mass flow plenum region.

In accordance with one or more aspects of the present disclosure the continuously steady state isolation barrier of fluid flow of the continuous steady state fluid mass flow plenum region is generated to provide a predetermined offset from the other predetermined section of the cassette support isolated by the continuously steady state isolation barrier of fluid flow, and the predetermined offset is set by the fluid mass flow of the continuous steady state fluid mass flow plenum region.

In accordance with one or more aspects of the present disclosure further including controlling, with a controller, the predetermined continuous steady state differential pressure plenum region depending on a configuration of the at least one substrate cassette container.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims, that may be appended hereto, does not indicate that a combination of these features cannot be advantageously used, such a combination remaining within the scope of the aspects of the present disclosure.

What is claimed is:

1. A substrate loading device comprising:
a frame adapted to connect the substrate loading device to a substrate processing apparatus, the frame having a transport opening through which substrates are transported between the substrate loading device and processing apparatus;
a cassette support connected to the frame for holding at least one substrate cassette container proximate the transport opening, the cassette support being configured so that a sealed internal atmosphere of the at least one substrate cassette container is accessed from the cassette support at predetermined access locations of the at least one substrate cassette container; and
the cassette support has a predetermined continuous steady state differential pressure plenum region disposed on the cassette support, determined at least in part by boundaries of fluid flow generating differential pressure, so that the predetermined continuous steady state differential pressure plenum region defines a continuously steady state fluidic flow isolation barrier disposed on the carrier support between the predetermined access locations of the at least one substrate cassette container and another predetermined section of the cassette support isolating the other predetermined section from the predetermined access locations.

2. The substrate loading device of claim 1, wherein fluid edges of the fluid flow of the continuous steady state fluidic flow isolation barrier seal the other predetermined section from the predetermined access locations.

3. The substrate loading device of claim 1, wherein fluid edges of the fluid flow of the continuous steady state fluidic flow isolation barrier seal the other predetermined section from escapement of venting gas from the sealed internal atmosphere of the at least one substrate cassette container at the predetermined access locations.

4. The substrate loading device of claim 1, wherein the differential pressure is a positive pressure relative to atmosphere.

5. The substrate loading device of claim 1, wherein the differential pressure is a positive pressure relative to a pressure of escapement gas from the sealed internal atmosphere of the at least one substrate cassette container at the predetermined access locations.

6. The substrate loading device of claim 1, wherein the differential pressure is a negative pressure relative to atmosphere.

7. The substrate loading device of claim 1, wherein the differential pressure is a negative pressure relative to pressure of an escapement gas from the sealed internal atmosphere of the at least one substrate cassette container at the predetermined access locations.

8. The substrate loading device of claim 1, wherein the predetermined continuous steady state differential pressure plenum region is bounded at least on one side by a surface of the cassette support defining the predetermined continuous steady state differential pressure plenum region at least in part.

9. The substrate loading device of claim 8, wherein the surface is a guide surface for the fluid flow generating the differential pressure of the predetermined continuous steady state differential pressure plenum region.

10. The substrate loading device of claim 1, wherein the continuously steady state fluidic flow isolation barrier of the continuous steady state differential pressure plenum region is generated to provide a predetermined offset from the other predetermined section of the cassette support isolated by the continuously steady state fluidic flow isolation barrier, and the predetermined offset is set by the fluid flow generating the differential pressure of the continuous steady state differential pressure plenum region.

11. The substrate loading device of claim 1, wherein the substrate loading device includes a controller that controls the predetermined continuous steady state differential pressure plenum region depending on a configuration of the at least one substrate cassette container.

12. A substrate loading device comprising:
a frame adapted to connect the device to a substrate processing apparatus, the frame having a transport opening through which substrates are transported between the device and processing apparatus;
a cassette support connected to the frame for holding at least one substrate cassette container proximate the transport opening, the support being configured so that a sealed internal atmosphere of the container is accessed from the support at predetermined access locations of the container; and
the cassette support has a predetermined continuous steady state fluid mass flow plenum region disposed on the support, determined at least in part by boundaries of fluid mass flow, so that the continuous steady state fluid mass flow plenum region defines a continuous steady state isolation barrier of fluid flow disposed on the support between the predetermined access locations of the container and another predetermined section of the cassette support isolating the other predetermined section from the predetermined access locations.

13. The substrate loading device of claim 12, wherein fluid edges of the fluid flow of the continuous steady state isolation barrier of fluid flow seal the other predetermined section from the predetermined access locations.

14. The substrate loading device of claim 12, wherein fluid edges of the fluid flow of the continuous steady state isolation barrier of fluid flow seal the other predetermined section from escapement of venting gas from the sealed internal atmosphere of the at least one substrate cassette container at the predetermined access locations.

15. The substrate loading device of claim 12, wherein the differential pressure is a positive pressure relative to atmosphere.

16. The substrate loading device of claim 12, wherein the fluid mass flow has a positive pressure relative to a pressure of escapement gas from the sealed internal atmosphere of the at least one substrate cassette container at the predetermined access locations.

17. The substrate loading device of claim 12, wherein the fluid mass flow has a negative pressure relative to atmosphere.

18. The substrate loading device of claim 12, wherein the fluid mass flow has a negative pressure relative to pressure of an escapement gas from the sealed internal atmosphere of the at least one substrate cassette container at the predetermined access locations.

19. The substrate loading device of claim 12, wherein the predetermined continuous steady state fluid mass flow plenum region is bounded at least on one side by a surface of the cassette support defining the predetermined continuous steady state fluid mass flow plenum region at least in part.

20. The substrate loading device of claim 19, wherein the surface is a guide surface for the fluid mass flow of the predetermined continuous steady state fluid mass flow plenum region.

21. The substrate loading device of claim 12, wherein the continuously steady state isolation barrier of fluid flow of the continuous steady state fluid mass flow plenum region is generated to provide a predetermined offset from the other predetermined section of the cassette support isolated by the continuously steady state isolation barrier of fluid flow, and the predetermined offset is set by the fluid mass flow of the continuous steady state fluid mass flow plenum region.

22. The substrate loading device of claim 12, wherein the substrate loading device includes a controller that controls the predetermined continuous steady state differential pressure plenum region depending on a configuration of the at least one substrate cassette container.

23. A method comprising:
providing a frame of a substrate loading device, the frame being adapted to connect the substrate loading device to a substrate processing apparatus, the frame having a transport opening through which substrates are transported between the substrate loading device and processing apparatus;
providing a cassette support connected to the frame for holding at least one substrate cassette container proximate the transport opening, the cassette support being configured so that a sealed internal atmosphere of the at least one substrate cassette container is accessed from the cassette support at predetermined access locations of the at least one substrate cassette container; and
defining, with a predetermined continuous steady state differential pressure plenum region, a continuously steady state fluidic flow isolation barrier disposed on the carrier support between the predetermined access locations of the at least one substrate cassette container and another predetermined section of the cassette support isolating the other predetermined section from the predetermined access locations, where the cassette support has the predetermined continuous steady state differential pressure plenum region disposed on the cassette support and the predetermined continuous steady state differential pressure plenum region is determined at least in part by boundaries of fluid flow generating differential pressure.

24. The method of claim 23, further comprising sealing, with fluid edges of the fluid flow of the continuous steady state fluidic flow isolation barrier, the other predetermined section from the predetermined access locations.

25. The method of claim 23, further comprising sealing, with fluid edges of the fluid flow of the continuous steady state fluidic flow isolation barrier, the other predetermined section from escapement of venting gas from the sealed internal atmosphere of the at least one substrate cassette container at the predetermined access locations.

26. The method of claim 23, wherein the differential pressure is a positive pressure relative to atmosphere.

27. The method of claim 23, wherein the differential pressure is a positive pressure relative to a pressure of escapement gas from the sealed internal atmosphere of the at least one substrate cassette container at the predetermined access locations.

28. The method of claim 23, wherein the differential pressure is a negative pressure relative to atmosphere.

29. The method of claim 23, wherein the differential pressure is a negative pressure relative to pressure of an escapement gas from the sealed internal atmosphere of the at least one substrate cassette container at the predetermined access locations.

30. The method of claim 23, wherein the predetermined continuous steady state differential pressure plenum region is bounded at least on one side by a surface of the cassette support defining the predetermined continuous steady state differential pressure plenum region at least in part.

31. The method of claim 30, wherein the surface is a guide surface for the fluid flow generating the differential pressure of the predetermined continuous steady state differential pressure plenum region.

32. The method of claim 23, wherein the continuously steady state fluidic flow isolation barrier of the continuous steady state differential pressure plenum region is generated to provide a predetermined offset from the other predetermined section of the cassette support isolated by the continuously steady state fluidic flow isolation barrier, and the predetermined offset is set by the fluid flow generating the differential pressure of the continuous steady state differential pressure plenum region.

33. The method of claim 23, further comprising controlling, with a controller, the predetermined continuous steady state differential pressure plenum region depending on a configuration of the at least one substrate cassette container.

* * * * *